United States Patent
Eschauzier et al.

(10) Patent No.: US 7,973,596 B2
(45) Date of Patent: Jul. 5, 2011

(54) LOW-NOISE, LOW-POWER, LOW DRIFT OFFSET CORRECTION IN OPERATIONAL AND INSTRUMENTATION AMPLIFIERS

(75) Inventors: Rudy G. H. Eschauzier, Bergschenhoek (NL); Nico van Rijn, Katwijk (NL)

(73) Assignee: Number 14 B.V., Bergschenhoek (NL)

( * ) Notice: Subject to any disclaimer, the term of this patent is extended or adjusted under 35 U.S.C. 154(b) by 71 days.

(21) Appl. No.: 12/464,572

(22) Filed: May 12, 2009

(65) Prior Publication Data

US 2010/0289568 A1    Nov. 18, 2010

(51) Int. Cl.
*H03F 1/02*    (2006.01)

(52) U.S. Cl. .............................. 330/9; 330/51

(58) Field of Classification Search .......... 330/9, 124 R, 330/295; 327/124, 307

See application file for complete search history.

(56) References Cited

U.S. PATENT DOCUMENTS 6,734,723 B2 * 5/2004 Huijsing et al. .................. 330/9

OTHER PUBLICATIONS

Dessouky, Mohamed, et al., "Very Low-Voltage Digital-Audio ΔΣ Modulator with 88-dB Dynamic Range Using Local Switch Bootstrapping", *IEEE Journal of Solid-State Circuits*, vol. 36, No. 3, (Mar. 2001), pp. 349-355.

Enz, Christian C., et al., "Circuit Techniques for Reducing the Effects of Op-Amp Imperfections: Autozeroing, Correlated Double Sampling, and Chopper Stabilization", *Proceedings of the IEEE*, vol. 84, No. 11, (Nov. 1996), pp. 1584-1614.

Eschauzier, Rudy G., et al., "Frequency Compensation Techniques for Low-Power Operational Amplifiers", Section 6.1, Springer, (1995).

Eschauzier, Rudy G., et al., "Frequency Compensation Techniques for Low-Power Operational Amplifiers", Section 6.3, Springer, (1995).

Huijsing, Johan H., "Operational Amplifiers, Theory and Design", Kluwer Academic Publishers, (2001), pp. 52-53.

Weste, Neil H., et al., "Principles of CMOS VLSI Design, A Systems Perspective, Second Edition", Section 5.5.10, Addison-Wesley Publishing Company, (1993), pp. 346-350.

* cited by examiner

*Primary Examiner* — Robert Pascal
*Assistant Examiner* — Khiem D Nguyen
(74) *Attorney, Agent, or Firm* — Blakely Sokoloff Taylor & Zafman LLP

(57) ABSTRACT

Low-noise, low-power, low drift offset correction in operational and instrumentation amplifiers and amplifiers using the same are disclosed. The amplifiers disclosed use different combinations of chopping and auto-zero techniques. Also disclosed are amplifiers using on-off switches to affect the chopping and auto-zeroing, with unique circuits for driving the switches on the differential input to provide boot-strapped switch controls. Other features are disclosed.

28 Claims, 17 Drawing Sheets

LOW-NOISE, LOW-POWER, LOW DRIFT OFFSET CORRECTION IN OPERATIONAL AND INSTRUMENTATION AMPLIFIERS

BACKGROUND OF THE INVENTION

1. Field of the Invention

The present invention relates to the field of operational and instrumentation amplifiers.

2. Prior Art

One of the key performance specifications of an operational amplifier is its DC error or offset voltage. The offset voltage limits the ability of the amplifier to resolve small DC input voltages. The total offset voltage is usually specified assuming a single source of error at the input terminals. The value of this imaginary voltage source represents the input referred offset voltage of the amplifier. The significance of this parameter lies in the fact that the amplifier will not be able to resolve any DC voltages at its input that are smaller than the input referred offset voltage.

In monolithically integrated operational amplifiers, the input referred offset voltage (also called input offset, offset voltage or just offset for short) is mostly due to statistical mismatch between critical components in the circuit. Commonly, these critical components include the input stage transistors, but other devices may contribute significantly to the offset as well. Typical offset voltages due to component mismatch lie in the order of several millivolts.

In the past, many techniques have been proposed and implemented to limit the effect of statistical mismatch on the input referred offset voltage. These techniques fall into one of two categories (see "Circuit Techniques for Reducing the Effects of Op-Amp Imperfections: Autozeroing, Correlated Double Sampling, and Chopper Stabilization", C. C. Enz and G. C. Temes, *IEEE J. Solid-State Circuits*, vol. 84, November 1996, pp. 1584-1614).

1. Chopper Stabilization
2. Autozeroing

The following will address each of these techniques, along with their respective advantages and disadvantages.

Chopper Stabilization

Chopper stabilization relies on periodically swapping the signal paths for the negative and positive input terminals of the amplifier. On average, this causes the offset between the two terminals to even out (see "Circuit Techniques for Reducing the Effects of Op-Amp Imperfections: Autozeroing, Correlated Double Sampling, and Chopper Stabilization", C. C. Enz and G. C. Temes, *IEEE J. Solid-State Circuits*, vol. 84, November 1996, pp. 1584-1614). FIG. 1 shows the block diagram of a chopper stabilized amplifier.

The input referred offset voltage of the input stage $g_{m1}$ is represented by voltage source $V_{os}$. The behavior of the choppers is to multiply their input signal by +1 or −1, depending on the state of clock phase $\phi_2$. In the case of a differential signal (e.g. chopper $chop_1$), multiplying by −1 simply means swapping the input signals. Multiplying by +1 indicates direct connections between inputs and outputs.

Note how for one clock phase the input offset source $V_{os}$ will cause a negative error voltage at the output, while for the other phase the effect will be a positive voltage. The net output error voltage, averaged over time, will be zero.

For the input signal the situation is different. In this case the signal passes to both choppers $chop_1$ and $chop_2$, and the polarity of the output signal will not change. Therefore, the output signal will consist of the unmodified input signal, and a ripple voltage caused by chopping by chopper $chop_2$ of the input offset voltage $V_{os}$.

Alternatively, in the frequency domain the choppers $chop_1$ and $chop_2$ can be regarded as multipliers or mixers, shifting the input frequencies by the chopper frequency $f_{chop}$. From this point of view, chopper $chop_1$ will convert up a DC input signal to the chopper frequency $f_{chop}$. Input stage $g_{m1}$ will then amplify the resulting signal at $f_{chop}$, while chopper $chop_2$ converts the signal back to DC. Note that the DC input signal reappears as a DC signal at the output of chopper $chop_2$. This is because at this point the signal has passed through two choppers, implementing up and down conversion of the input signal.

The situation for the offset source $V_{os}$ is different, however. Since there is only one chopper between the offset source $V_{os}$ and the output, the DC offset voltage $V_{os}$ will get up converted to the chopper frequency $f_{chop}$ at the output. By low pass filtering (or averaging) the output the effect of the offset source $V_{os}$ can then be eliminated.

Besides to the DC offset, the same frequency up conversion applies to any 1/f or low frequency noise of input stage $g_{m1}$. Therefore, the 1/f noise is shifted out of the signal band in the same way the DC offset is.

The gain stages $g_{m1}$, $g_{m4}$ and $g_{m5}$ comprise the chopped signal path. Since DC offset is—by definition—a low-frequency phenomenon, the chopped signal path does not require a very high bandwidth. Instead, the parallel input stage $g_{m3}$ is added to the circuit to deal with high frequency signals. Together, input stages $g_{m1}$ and $g_{m3}$ handle the entire spectrum from DC up to the bandwidth of the amplifier. Capacitors $C_{m1}$ and $C_{m2}$ implement frequency compensation to ensure stability when applying feedback to the amplifier, as well as a smooth transition between the high and low frequency portions of the amplifier gain. This frequency compensation setup is based on Multipath Nested Miller Compensation (see "Frequency Compensation Techniques for Low-Power Operational Amplifiers", R. Eschauzier and J. Huijsing, section 6.1, Boston, Mass.: Kluwer, 1995, section 6.1, Boston, Mass.: Kluwer, 1995).

A significant benefit of the chopping technique, besides its effectiveness in reducing offset and 1/f noise, is that the noise power density spectrum (PSD) at low frequencies approaches the thermal noise limit of the amplifier without choppers.

The main disadvantage of chopping is that the output spectrum of the chopper stabilized amplifier will show a sharp peak around the chopper frequency fchop (FIG. 2).

This noise peak is caused by the up conversion of the offset voltage and 1/f noise of the input stage $g_{m1}$, and corresponds to the ripple voltage at the output of the amplifier in the time domain.

Autozeroing

Autozeroing includes techniques that calibrate out the input offset by measuring the offset, storing it into some kind of internal memory, and then compensating for the error during normal operation. This process is very similar to zeroing a weighing scale for example. The moment of calibration can be during manufacturing, in which case the measured offset needs to be stored onto a non-volatile memory, to ensure that the measured offset value does not disappear after the part is powered down. Alternatively, the autozeroing can be performed during normal operation, by periodically interrupting the signal path for a brief calibration. In this case, the measured voltage needs to be retained for a short amount of time only, allowing the use of volatile memory, or even a capacitor to store the value. The advantage of autozeroing during normal operation is that as the offset of the amplifier shifts, e.g. due to temperature changes or aging, the autozeroing will track the changes and continue to compensate for it.

Autozeroing during manufacturing does not compensate for varying conditions, and is therefore susceptible to offset drift.

FIG. 3 shows the simplified block diagram of an amplifier using autozeroing to reduce its offset.

It comprises of input stage $g_{m1}$ with its associated input referred offset voltage source $V_{os}$. The switches $S_1$ and $S_2$, transconductor $g_{m2}$ and capacitor $C_i$ implement the autozero function. When clock phase $\phi_1$ is high (autozero), switch $S_1$ shorts the input terminals of input stage $g_{m1}$. Switch $S_2$ closes a feedback loop around stage $g_{m2}$, which forces the output voltage of input stage $g_{m1}$ to zero. After the feedback loop settles, the voltage on autozero capacitor $C_i$ counteracts the input referred offset voltage $V_{os}$.

The moment clock phase $\phi_1$ goes low (normal operation), switch $S_2$ opens the feedback loop around transconductor $g_{m2}$. Because of the high input impedance of transconductor $g_{m2}$, the voltage across the autozero capacitor $C_i$ remains constant (sample-and-hold), and continues to compensate for the offset voltage $V_{os}$.

With clock phase $\phi_1$ low, input switch $S_1$ goes from shorting out the input stage $g_{m1}$ to directly connecting the input terminals of the amplifier to the input stage $g_{m1}$. Input stage $g_{m1}$ now operates as a normal input stage, connected between the input terminals of the amplifier and the subsequent gain stages $g_{m4}$ and $g_{m5}$. As a result of the calibration in the previous clock phase, the small current $I_2$ that transconductor $g_{m2}$ adds to the output current of input stage $g_{m1}$ exactly compensates for the error current at the output of $g_{m1}$ due to offset voltage $V_{os}$. In other words, the autozero current $I_2$ effectively eliminates the input referred offset voltage $V_{os}$ of the amplifier.

Besides eliminating DC offset, the autozero process is also very effective against low-frequency or 1/f noise. This noise component can be regarded as a slowly varying offset voltage, and as long as the amplifier is autozeroed with short enough intervals, any 1/f noise will be removed in the same fashion DC offset is.

The autozeroed amplifier in FIG. 3 separates high and low frequency signals and processes them through two parallel signal paths, as was the case with the chopper stabilized amplifier of FIG. 1. The gain stages $g_{m1}$, $g_{m4}$ and $g_{m5}$ comprise the low-frequency autozeroed signal path, while the parallel input stage $g_{m3}$ deals with high frequency signals. Capacitors $C_{m1}$ and $C_{m2}$ again implement Multipath Nested Miller Compensation (see "Frequency Compensation Techniques for Low-Power Operational Amplifiers", R. Eschauzier and J. Huijsing, section 6.1, Boston, Mass.: Kluwer, 1995., section 6.1, Boston, Mass.: Kluwer, 1995), ensuring stability and a smooth frequency response.

Although autozeroing according to FIG. 3 is a simple and effective method to reduce the input offset, it greatly deteriorates the noise properties of the amplifier due to a process called wide-band noise sampling (see "Circuit Techniques for Reducing the Effects of Op-Amp Imperfections: Autozeroing, Correlated Double Sampling, and Chopper Stabilization", C. C. Enz and G. C. Temes, *IEEE J. Solid-State Circuits*, vol. 84, November 1996, pp. 1584-1614).

Wide-band noise sampling, which is inherent to any sample-and-hold action, is caused by the fact that the instantaneous noise value at the output of input stage $g_{m1}$ (and also autozero stage $g_{m2}$) is sampled by autozero capacitor $C_i$ and held for the entire period that $\phi_1$ is low (normal operation). The sampling of the noise takes place by switch $S_2$ and capacitor $C_i$, which are both components with a bandwidth that far exceeds the bandwidth of the amplifier. Therefore, the noise is sampled with a very high bandwidth, which results in a corresponding high rms value (or standard deviation $\sigma$) of the sampled noise voltage in the time domain. As a result, the sampled voltage on autozero capacitor $C_i$ at the end of each autozero period shows a significant random variation. This variation causes a random input referred offset voltage that changes at the end of each autozero interval, and is then kept constant throughout an entire period of normal operation.

In the frequency domain, this wide-band noise sampling causes an increase in the noise floor for low frequencies (see FIG. 4).

The corner frequency $\omega_c$ of this elevated noise band is set by the bandwidth of the autozero loop through transconductor $g_{m2}$, switch $S_2$ and autozero capacitor $C_i$ and equals $g_{m2}/C_i$.

In the circuit of FIG. 3, there is also another, second, source of wide-band noise sampling. This is due to the sample-and-hold action of switch $S_2$ and the integrating capacitor $C_{m2}$ during the autozero period. As a result, the noise floor beyond the corner frequency of the autozero loop will also be higher compared to the thermal noise limit of the amplifier without autozeroing. The bandwidth of this sampled noise spectrum is approximately equal to the frequency at which the amplifier is autozeroed (and lies beyond the maximum frequency on the X-axis of FIG. 4.)

The noise power spectral density (or PSD) of the overall amplifier is shown in FIG. 4. Due to the multiple sample-and-hold actions in the circuit, the overall noise density is significantly higher than the thermal noise limit of the circuit without autozeroing. For low frequencies, the noise increase is especially noticeable, and in practice can be a factor 10 or more. Note that compensating for this elevated noise level by lowering the thermal noise of $g_{m1}$ (and $g_{m2}$), would mean that the currents in these stages will have to go up by the same factor 10. In many cases such a large supply current increase will turn out to be an unacceptable impact to the total power budget of the amplifier.

DETAILED DESCRIPTION OF THE PREFERRED EMBODIMENTS

In the attached drawings, for reference, in instances where it matters, all switches are shown in states for a respective low control signal. In that regard, the word switch is used herein and in the following claims in both the singular and the plural sense, and in the sense to include an on/off switch or switches, and switches that alternately connect one line to either of two other lines. However when used in the plural sense, each such switch is responsive to the same control signal. Also the word amplifier as used herein means an amplifier of one or more stages, and may include frequency compensation.

Table 1 summarizes the properties of the chopping and autozeroing techniques for reducing the DC offset and 1/f noise of an amplifier.

TABLE 1

Properties of chopping and autozeroing.

|  | Advantage | Disadvantage |
|---|---|---|
| Chopping | Low-noise | Output ripple |
| Autozeroing | No output ripple | Wide-band noise sampling |

Clearly, each of the techniques has its own set of advantages and disadvantages. Chopping results in low noise, but causes a significant output ripple, while autozeroing suffers from wide-band noise sampling, and hence high noise, but does not generate a ripple at the output.

Figure 5:
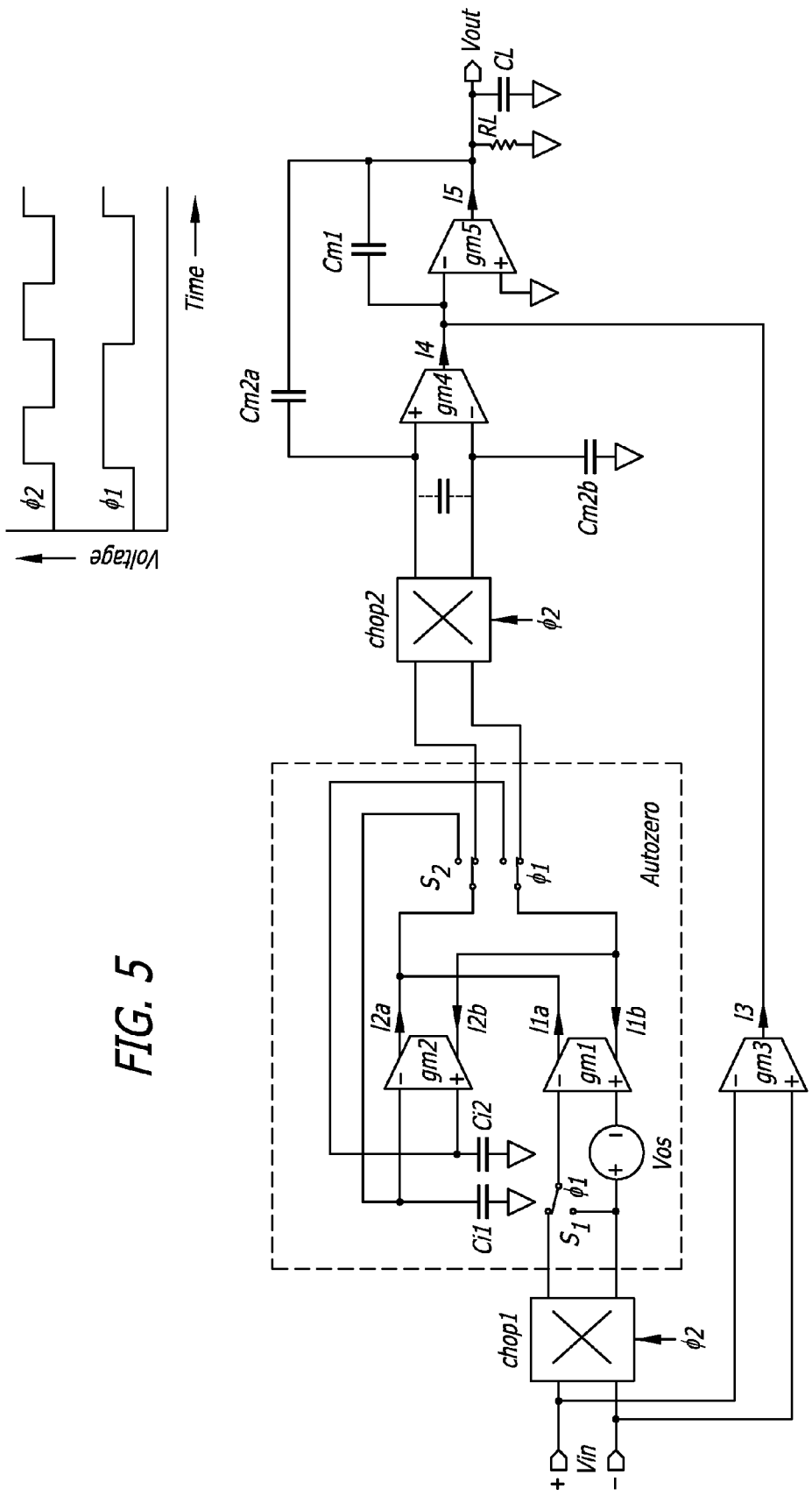
FIG. 5 is a block diagram of one circuit combining the advantages of chopping and autozeroing in a single amplifier.

Ideally, we would like to find an alternative approach that combines the advantages of chopping and autozeroing, i.e. low noise and small output ripple. FIG. 5 shows a first attempt at such a technique.

The circuit consists of autozeroed input stage $g_{m1}$ that is "embedded" between the two choppers $chop_1$ and $chop_2$. The order of operation of the various parts is as follows. When clock phase $\phi_1$ is high, input stage $g_{m1}$ is being autozeroed by switch $S_2$, transconductor $g_{m2}$ and autozero capacitor $C_i$. When clock phase $\phi_1$ goes low, input stage $g_{m1}$ enters normal operation, while the output current of transconductor $g_{m2}$ compensates for its input referred offset $V_{os}$. During this half cycle of normal operation, the two choppers $chop_1$ and $chop_2$ will go through a full clock cycle $\phi_2$, averaging out any remaining offset of autozeroed input stage $g_{m1}$. The cycle repeats by clock phase $\phi_1$ going high again, entering the amplifier into autozero.

At first sight, the circuit of FIG. 5 seems to have many advantages over only chopping or only autozeroing. Because the offset $V_{os}$ of $g_{m1}$ is already autozeroed, chopping by chopper $chop_2$ does not introduce any output ripple. Also, because the choppers shift any low-frequency noise of the autozeroed input stage $g_{m1}$ to the chopper frequency $f_{chop}$, the effect of the wide-band noise sampling by autozero capacitor $C_i$, is greatly eliminated. This can be seen in the noise it is shifted to the PSD of FIG. 6.

Clearly, the low frequency noise resulting from the wide band noise sampling by autozero capacitor $C_i$, is shifted to the chopper frequency $f_{chop}$. Finally, since both the autozeroing and chopping contribute to reducing the offset, the resulting input referred offset can be much lower than by using chopping or autozeroing alone.

Figure 1:
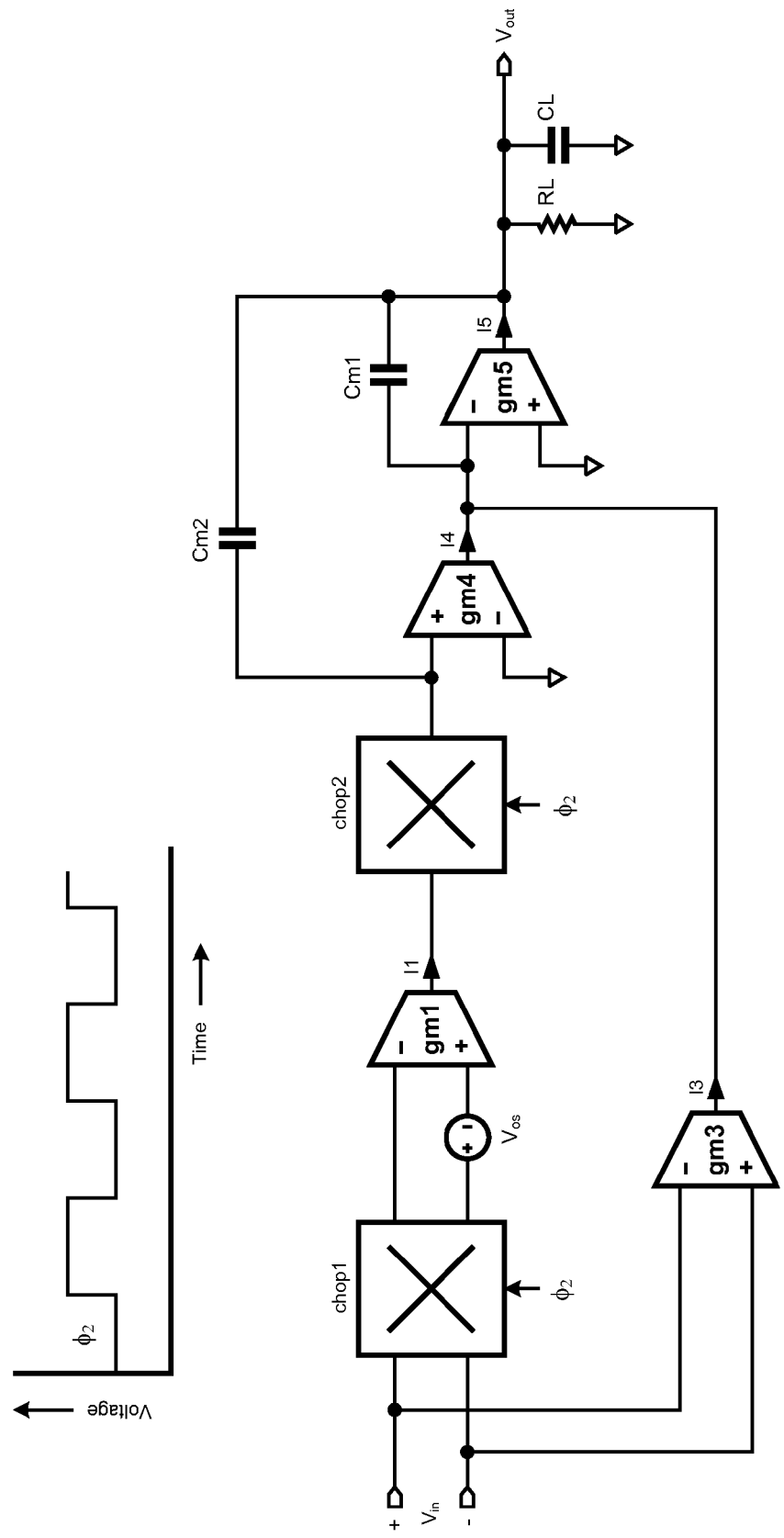
FIG. 1 is a block diagram of a Prior Art chopper stabilized amplifier.
Figure 2:
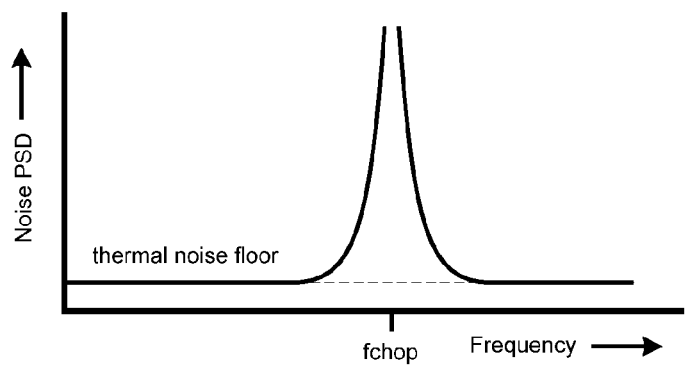
FIG. 2 illustrates the Noise Power Spectral Density (PSD) of a Prior Art chopper stabilized amplifier.
Figure 4:
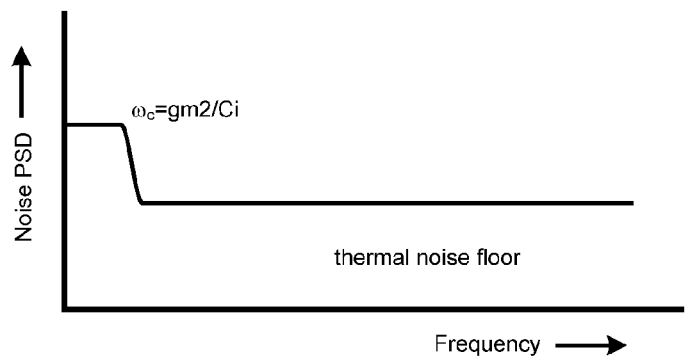
FIG. 4 illustrates the Noise PSD of a Prior Art autozeroed amplifier.
Figure 6:
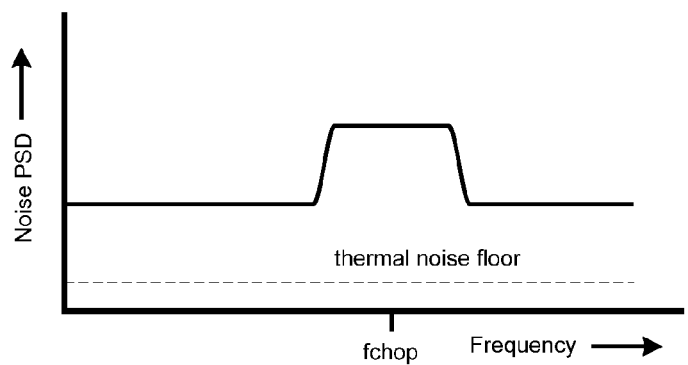
FIG. 6 illustrates the Noise PSD of the amplifier of FIG. 5 with both chopping and autozeroing.
Figure 3:
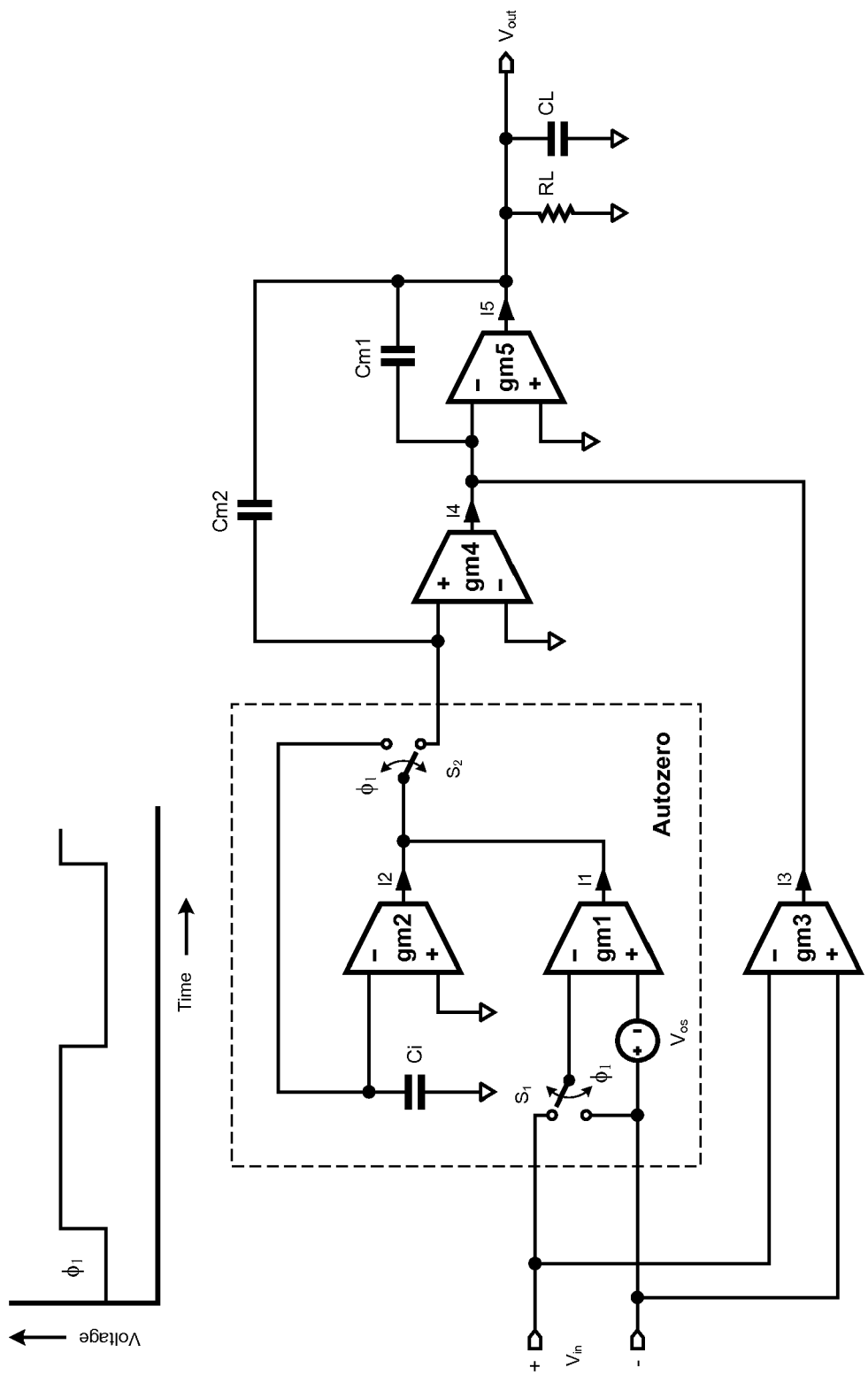
FIG. 3 is a block diagram of a Prior Art autozeroed amplifier.

The noise PSD of FIG. 6 also shows the main disadvantage of the combined autozeroed and chopped circuit of FIG. 5. Notice how the overall noise floor is raised significantly above the thermal noise limit of the amplifier. This elevated noise floor is entirely due to the sample-and-hold action of switch $S_2$ and Miller capacitor $C_{m2}$. While the input stage is being autozeroed (clock phase $\phi_1$ is high), the normal signal path is being interrupted. During this time, the voltage across Miller capacitor $C_{m2}$, holding the value at the time switch $S2$ opened, will determine the output voltage of the amplifier. The sample-and-hold effect of switch $S2$ and Miller capacitor $C_{m2}$ again gives rise to wide-band noise sampling. It can raise the overall noise floor by a factor 10 or more, all the way up to the autozero frequency $f_{az}$ (which is beyond the range on the x-axis of FIG. 6).

Figure 7:
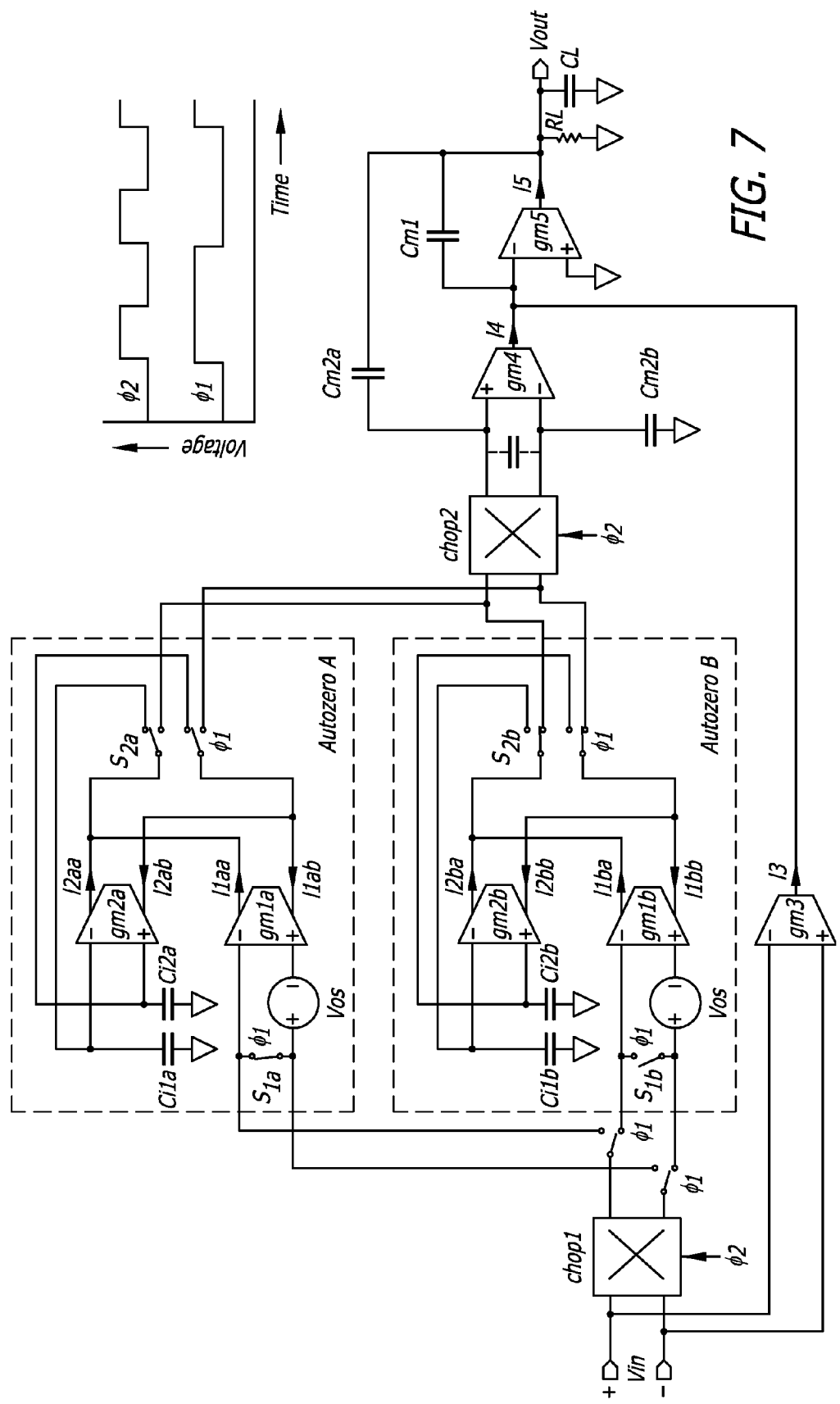
FIG. 7 is a block diagram of an Amplifier combining chopping and autozeroing with a ping-pong autozeroed input stage.

A simple way to avoid the wide-band noise sampling in the circuit of FIG. 5 is shown in FIG. 7.

Here, the input stage of the amplifier is implemented using two independent transconductors $g_{m1a}$ and $g_{m1b}$ in a so-called ping-pong setup. The two input transconductors are alternately being autozeroed. While one transconductor is in its autozero mode, the other will provide a signal path between the input terminals and the intermediate stage $g_{m4}$, and vice versa. As a result, the normal signal path will never be interrupted, and no wide-band noise sampling takes place on the Miller capacitor $C_{m2}$. This is apparent from the noise PSD in FIG. 8.

For low frequencies, the noise of the ping-pong circuit is identical to the thermal noise of the amplifier without chopping and autozeroing. The noise bump due to the autozeroing of $g_{m1a}$ and $g_{m1b}$ is shifted to the chopper frequency $f_{chop}$ by the two choppers $chop_1$ and $chop_2$, as was the case in the circuit of FIG. 5.

Figure 8:
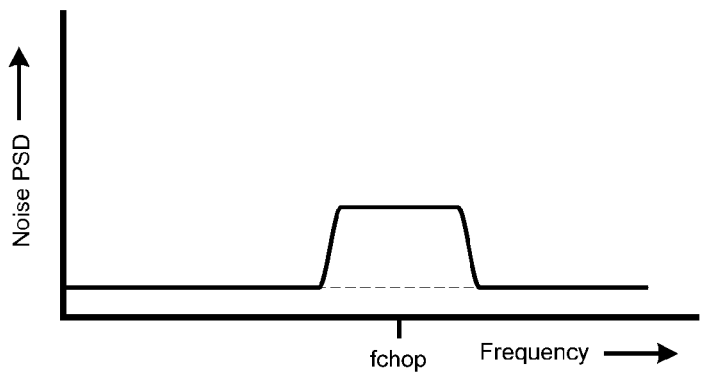
FIG. 8 illustrates the Noise PSD of the amplifier with ping-pong autozeroing.

Although the noise PSD of FIG. 8 approaches the ideal of low-noise and low output voltage ripple, this performance comes at a considerable price in terms of die area and power consumption. Because of the ping-pong structure, the input stage almost doubles in size and supply current. Since both area and supply current of the input stage are key in obtaining a low thermal noise floor, the die size and power penalty of doubling the input stage will be unacceptable in many practical cases.

Figure 9:
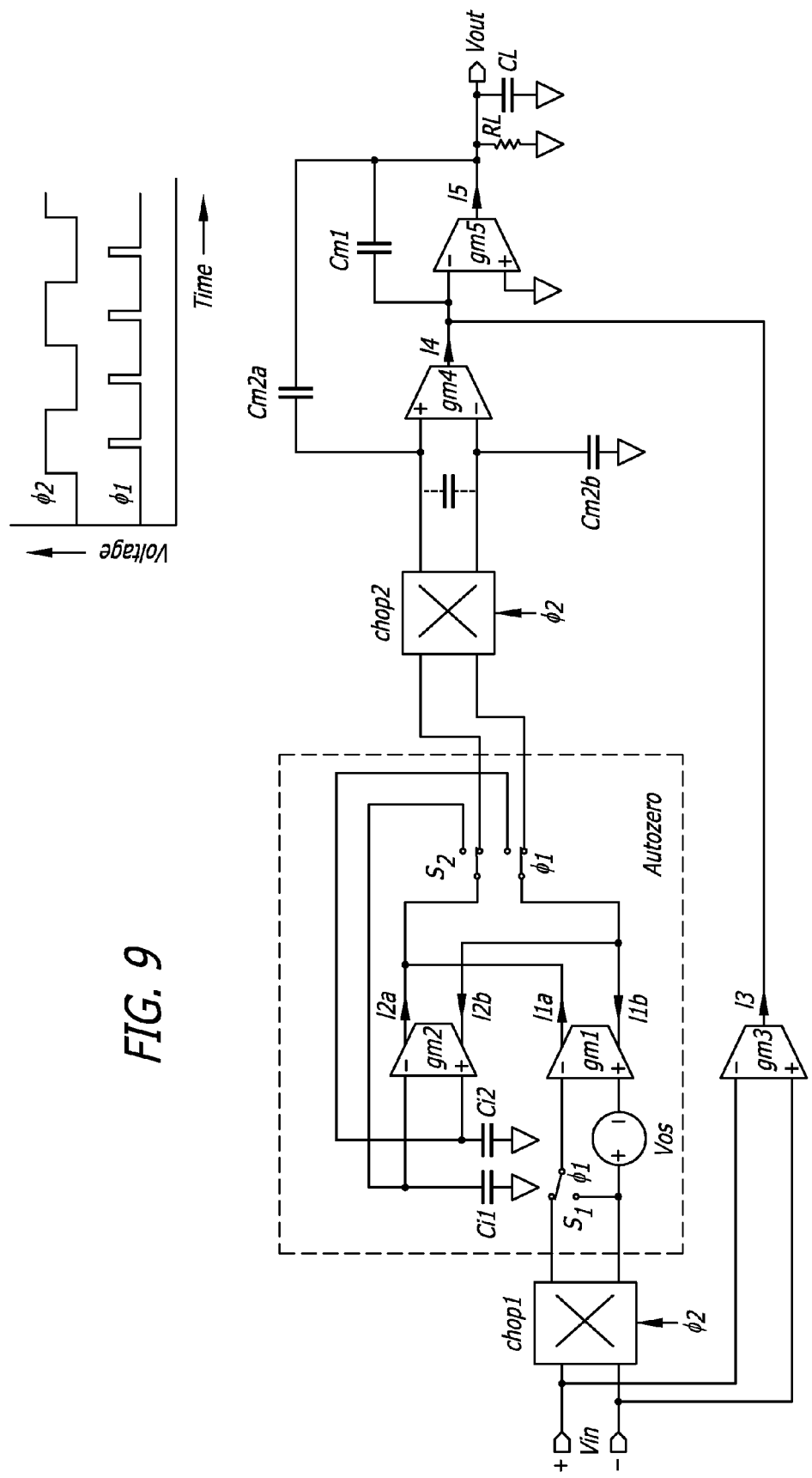
FIG. 9 is a block diagram of an Amplifier combining chopping and autozeroing with reduced wide-band noise sampling.

An alternative approach to combining the advantages of chopping and autozeroing, without the die size and power penalty of a ping-pong autozeroed input stage, is shown in FIG. 9.

This circuit is similar to the circuit of FIG. 5, but employs a modified clocking scheme. Instead of the autozero clock phase $\phi_1$ running at half the chopping frequency $f_{chop}$, it now operates at twice the chopping frequency $f_{chop}$. Also, the duty cycle is such, that the autozero time is substantially shorter than the time the input stage provides a normal signal path. Thus the duty cycle of $\phi_1$ is preferably less than 50%, and is more preferably not more than 25%. The result is that each half cycle of the choppers is interrupted by the auto-zeroing, though for less than one half of each half cycle of the chopping. This is also preferred for the embodiments of FIGS. 11, 12 and 13.

By placing the autozero pulse in the middle of each half cycle of the chopper clock phase $\phi_2$, chopper $C_{hop2}$ will average out any residual offset after autozeroing in the time between two autozero pulses. This residual offset averaging stems from the fact that during a period between two autozero pulses, the signal is passed through chopper $chop_2$ directly and with reversed polarity with the same duration.

Figure 10:
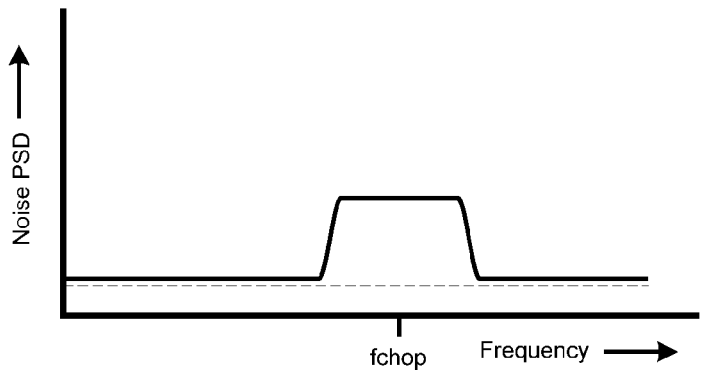
FIG. 10 illustrates the Noise PSD of the chopped and autozeroed amplifier with improved clocking scheme of FIG. 9.

The modified clocking scheme substantially reduces the wide-band noise sampling by switch $S_2$ and Miller capacitor $C_{m2}$. Even though the hold voltage on Miller capacitor $C_{m2}$ after opening $S_2$ still has the same large random variation as was the case in the circuit of FIG. 5, limiting the time this random voltage affects the signal path, greatly reduces its overall effect. This is shown in FIG. 10.

By choosing a suitably small autozero duty cycle, the overall noise increase due to the wide-band noise sampling can become arbitrarily small. In practice, by choosing a duty cycle less than 10% the noise floor of the circuit will be within several percent of the theoretical thermal noise floor limit.

Figure 11:
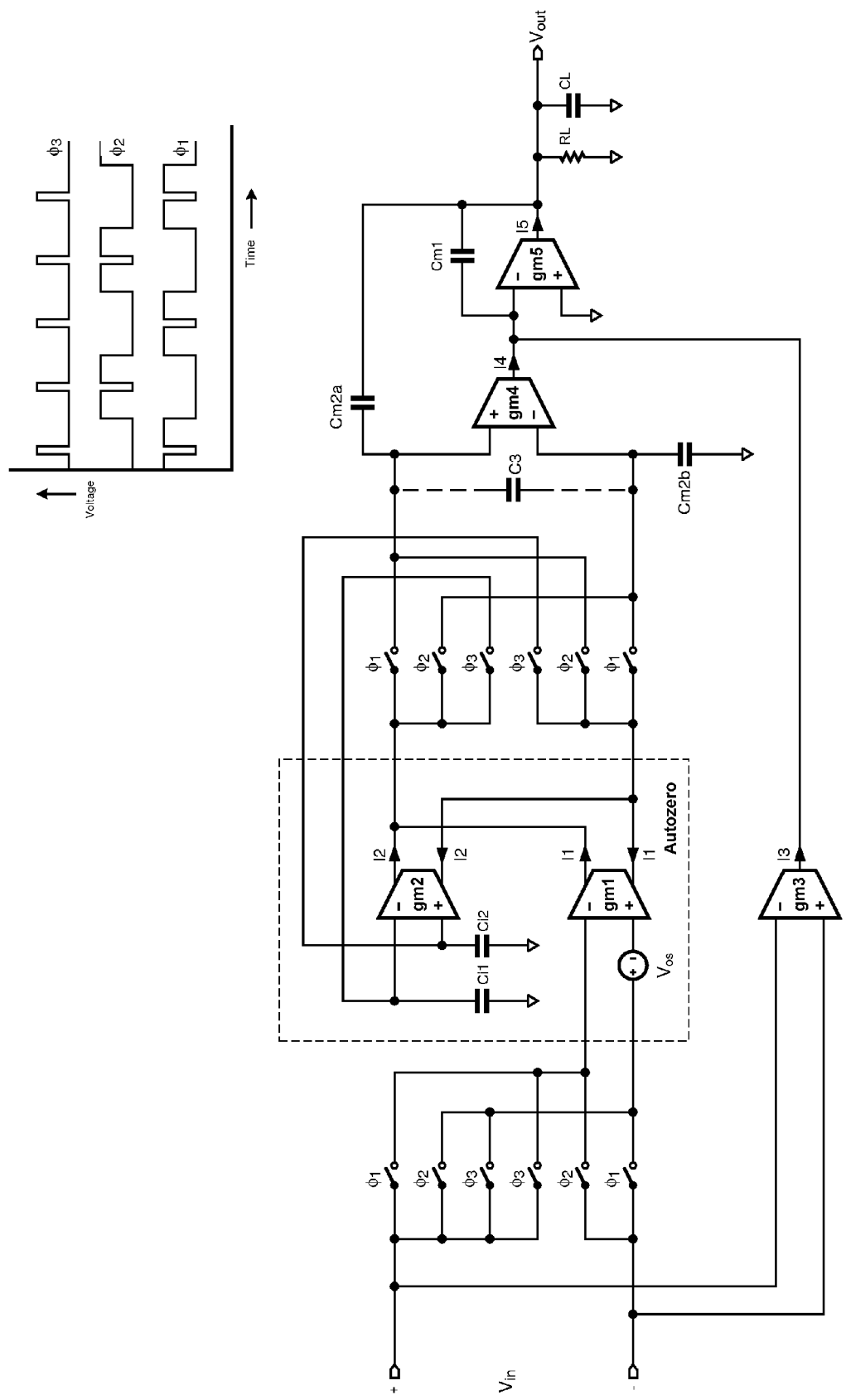
FIG. 11 is a block diagram of a Simplified chopped and autozeroed amplifier.

FIG. 11 shows a simplification of the circuit in FIG. 9.

Notice how in the previous circuit of FIG. 9 the autozero switches and internal chopper switches are connected in series, each with their own clocking phases. The circuit of FIG. 11 combines these series connections of switches into one switch where possible, and provides the proper clocking phases to drive them.

Operation is as follows. The first state of the circuit is when clock phase $\phi_3$ is high; the circuit is in autozero mode, with the switches labeled $\phi_3$ closed. As a result, the inputs of transconductor $g_{m1}$ are both tied to the positive input terminal. Hence, the input differential voltage of $g_{m1}$ is zero, while the voltage at the positive input sets the common-mode voltage. The output terminals of input transconductor $g_{m1}$ are connected to the autozero capacitors $C_{i1}$ and $C_{i2}$, closing the autozero loop.

The second state occurs after clock phase $\phi_3$ goes low again. Now there are two possible situations: either clock phase $\phi_1$ goes high, while phase $\phi_2$ remains low, or vice versa. Assuming the first case, $\phi_1$ high and $\phi_2$ low, input stage $g_{m1}$ is connected directly between the input terminals and the intermediate stage $g_{m4}$. Offset voltage source $V_{os}$ will cause a positive error voltage at the output of the amplifier. The two autozero capacitors $C_{i1}$ and $C_{i2}$ are disconnected from the signal path and hold their voltage to cancel out any offset of input stage $g_{m1}$.

The circuit enters its third and final state when $\phi_1$ and $\phi_2$ reverse polarities ($\phi_1$ low and $\phi_2$ high). In this situation, input stage $g_{m1}$ is effectively turned upside down, swapping both the input and output terminals. The polarity of the signal path remains the same, but the effect of input offset voltage $V_{os}$ at the output changes sign: it will cause a negative excursion of the output voltage.

Since states two and three have the same duration, the average effect of the offset source $V_{os}$ will be zero. State 1 is effectively operating at twice the frequency of states 2 and 3, though states 2 and 3 are each interrupted by state 1, with each half cycle of the chopping being temporarily interrupted by the auto-zeroing process.

The order of states two and three after each autozero pulse $\phi_3$ alternates. This results in the following overall order of the circuit states: 2-1-2, 3-1-3, 2-1-2 etc. The average (residual) offset across one autozero cycle, whether it is the 2-1-2 or the 3-1-3 cycle, will be zero.

Input stage $g_{m3}$ again implements a separate signal path for high frequencies. Together with capacitors $C_{m1}$, $C_{m2a}$ and $C_{m2b}$, this parallel input stage $g_{m3}$ implements Multipath Nested Miller Compensation (see "Frequency Compensation Techniques for Low-Power Operational Amplifiers", R. Eschauzier and J. Huijsing, section 6.1, Boston, Mass.: Kluwer, 1995). This frequency compensation technique ensures stability when applying feedback to the overall amplifier, while enabling a smooth frequency response without artifacts in the cross-over region between the high and low frequency signal paths. Capacitor $C_3$ is an optional component that can help the gain of the low-frequency signal path ($g_{m1}$, $g_{m4}$ and $g_{m5}$) to drop off steeply enough at high frequencies not to interfere with the high-frequency signal path through parallel input stage $g_{m3}$.

Figure 12:
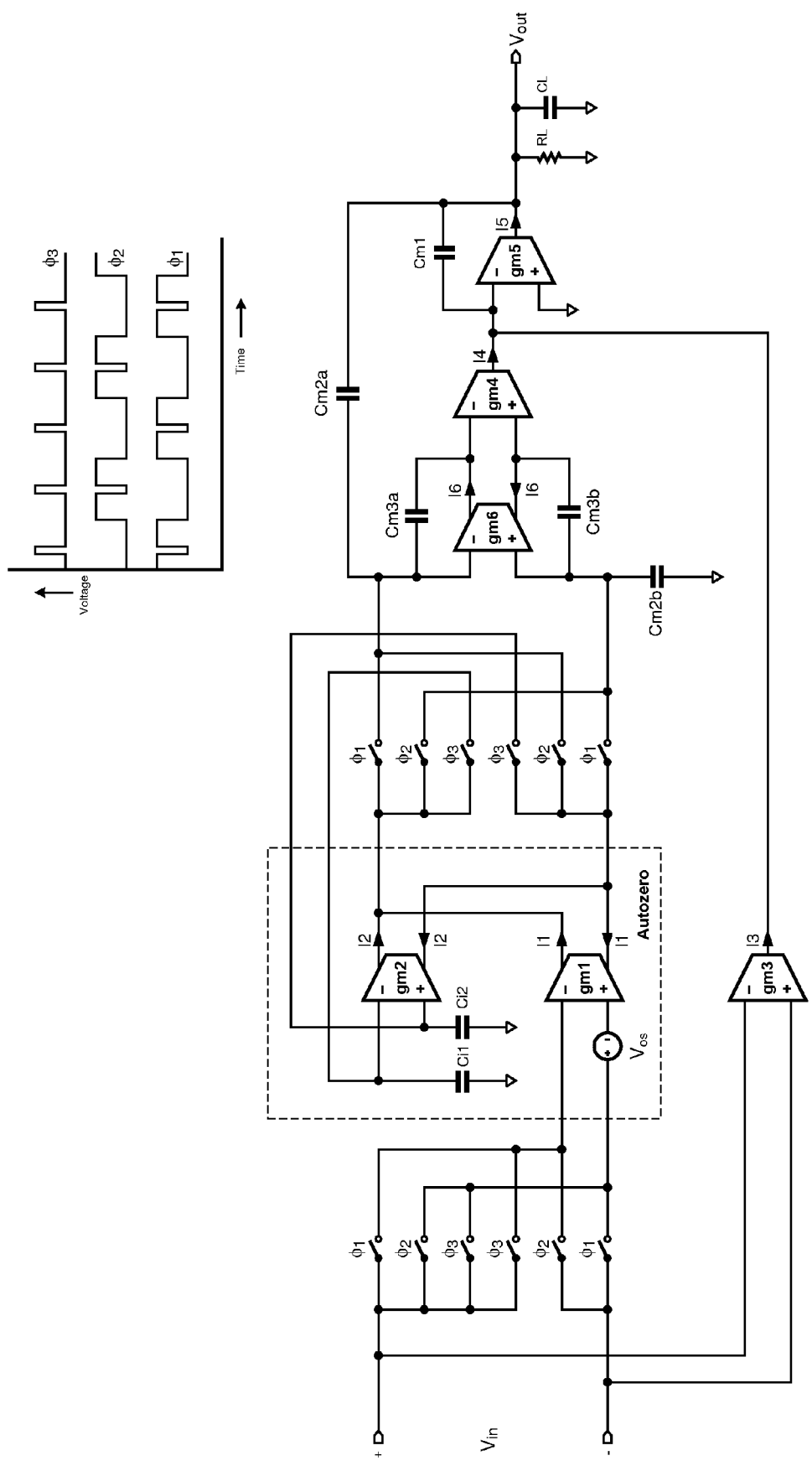
FIG. 12 is a block diagram of a Chopped and autozeroed amplifier using Multipath Hybrid Nested Miler Compensation.

A final refinement of the circuit in FIG. 11 is shown in FIG. 12.

This circuit is identical to the circuit of FIG. 11, except for the additional gain stage $g_{m6}$. The purpose of this additional stage is to increase the gain of the low-frequency signal path through input stage $g_{m1}$. This additional gain will help to suppress any DC offset of the overall amplifier due to mismatches in the parallel input stage $g_{m3}$. A DC offset in the parallel input stage $g_{m3}$ will cause an input referred offset voltage of the overall amplifier. The resulting input referred offset can be very small, however, as its effect is reduced by the ratio of the gains of the low frequency signal path and high frequency signal path. By introducing the additional gain stage $g_{m6}$, the circuit of FIG. 12 will offer gain ratios on the order of 10,000× or more in typical situations. Therefore, a DC offset of the parallel input stage $g_{m3}$ of 10 mV for example, will be reduced to less than a microvolt. At these low levels, the effect of a DC mismatch in the parallel input stage $g_{m3}$ is sufficiently small not to significantly affect the overall performance of the amplifier.

Because of the additional gain stage $g_{m6}$, the circuit of FIG. 12 now requires Multipath Hybrid Nested Miller compensation to guarantee stability with overall feedback applied (see "Frequency Compensation Techniques for Low-Power Operational Amplifiers", R. Eschauzier and J. Huijsing, section 6.3, Boston, Mass.: Kluwer, 1995). This frequency compensation technique is similar to Multipath Nested Miller Compensation used in FIG. 11, except that it uses an active integrator with Miller capacitors $C_{m3a}$ and $C_{m3b}$, as opposed to the passive filter capacitor $C_3$ in FIG. 11.

Instrumentation Amplifiers

By adding an additional input stage to any of the circuits in FIG. 5, FIG. 7, FIG. 9, FIG. 11 and FIG. 12, these can easily be transformed into so-called instrumentation amplifiers (see "Operational Amplifiers, Theory and Design", J. Huijsing, pp. 52-53, Boston, Kluwer Academic Publishers, 2001). Instrumentation amplifiers have two sets of differential input terminals and are capable of sensing small differential signals in the presence of a large common-mode disturbance.

In order for the chopping and autozeroing to work properly in the modified circuit, only the input stage devices (including the parallel devices for Multipath frequency compensation) and input switches need to be repeated from the original opamp. The autozeroing can be done across both input stages combined, and therefore does not require additional autozero capacitors, nor autozero feedback switches.

Figure 13:
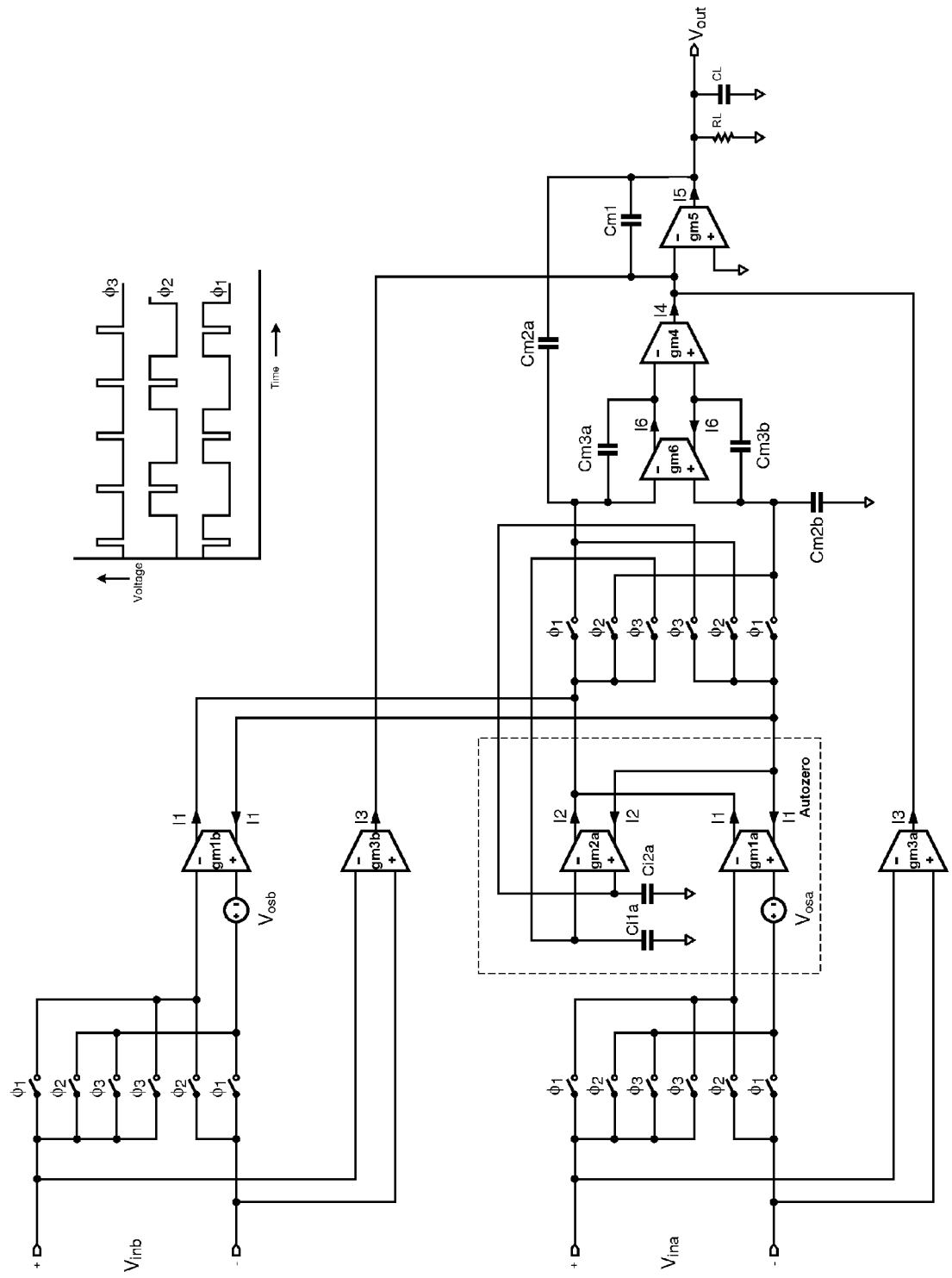
FIG. 13 is a block diagram of an Instrumentation amplifier with chopping and autozeroing.

FIG. 13 shows the chopped and autozeroed instrumentation amplifier that results from modifying the opamp depicted in FIG. 12. The components added to the circuit are the two input stages $g_{m1b}$ and $g_{m3b}$, along with the corresponding input switches.

Figure 21:
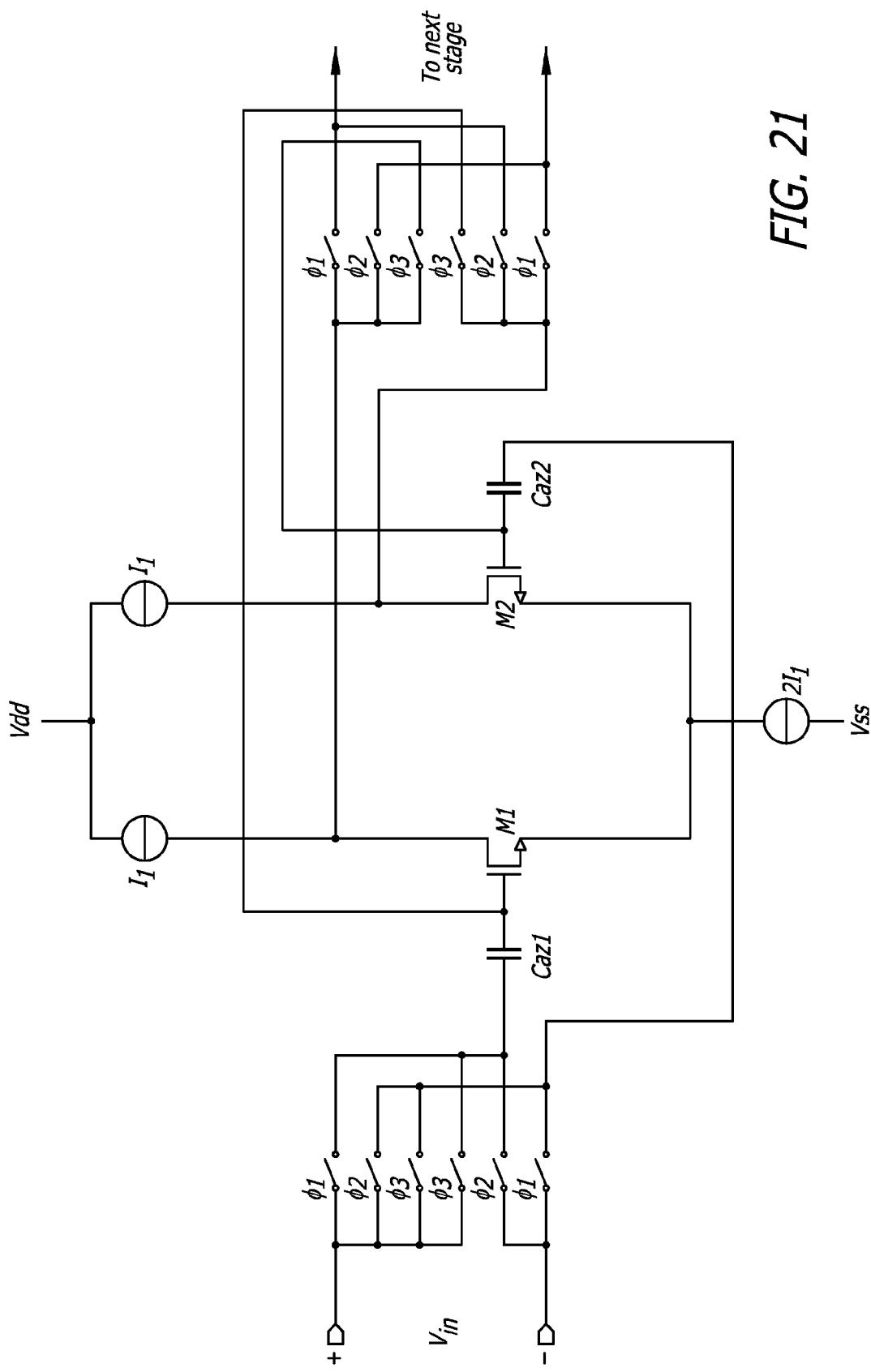
FIG. 21 illustrates an alternative form of autozero circuit using a single differential amplifier.

FIGS. 5, 7 and 9 implement one form of autozero circuit, also effectively incorporated in FIGS. 11, 12 and 13, though it should be understood that other forms of autozero circuits may be used. By way of example, FIG. 21 illustrates an alternative form of autozero circuit using a single differential amplifier rather than the two of the previous embodiment. In FIG. 21, a differential transistor pair M1 and M2 each have a drain current $I_1$ and a common source connection having a tail current of $2I_1$. Either the drain currents or the tail current can be controlled by a common mode voltage controlled current source to achieve the desired common mode input to the gates of the transistors M1 and M2. Note that this common mode voltage is unrelated to, and can be fixed and very different from, the common mode input to the amplifier system, the difference being the voltages across capacitors Caz1 and Caz2.

Clock phases $\phi_1$ and $\phi_2$ are the chopper clock phases. During autozeroing, clock phases $\phi_1$ and $\phi_2$ are low and the clock phase $\phi_3$ is high. Note that if the two drain currents $I_1$ are not perfectly matched, that mismatch, itself, will also cause an offset in the differential pair of transistors M1 and M2. However that offset is also autozeroed by the foregoing process so that a perfect match of the two drain current sources $I_1$ is not required.

In any autozero circuit, the input to the input stage is periodically disconnected and then shorted, with the offset then being stored on one or more capacitors for subtraction from the signal path between autozeroing operations. In the embodiments of FIGS. 5, 7, 9 and 11-13, a second amplifier is used, with the net input offset of both amplifiers gm1 and gm2 being stored on the capacitors on the input to the second amplifier. The offsets are cancelled by the second amplifier having a current output opposite the current output of the differential input stage when the input of the differential input stage is shorted. In the embodiment of FIG. 21, only one differential amplifier is used for the autozero operation, with the autozeroing being done by appropriately charging capacitors in series with the differential amplifier input.

Clock Generation

The clock phase $\phi_3$ can be thought of as the autozero phase, while the clock phase $\phi_1$ and $\phi_2$ can be (broadly) thought of as the two chopper phases. One complication that arises in the circuits of FIG. 11 and FIG. 12 is that only one of the sets of switches corresponding to a particular clock phase ($\phi_1$, $\phi_2$ or $\phi_3$) is allowed to be closed at any particular time. Closing two or more sets of switches will cause short circuits between the various nodes of the circuit. In order to guarantee this break-before-make behavior, the switches need to be driven by non-overlapping clock phases.

Figure 15:
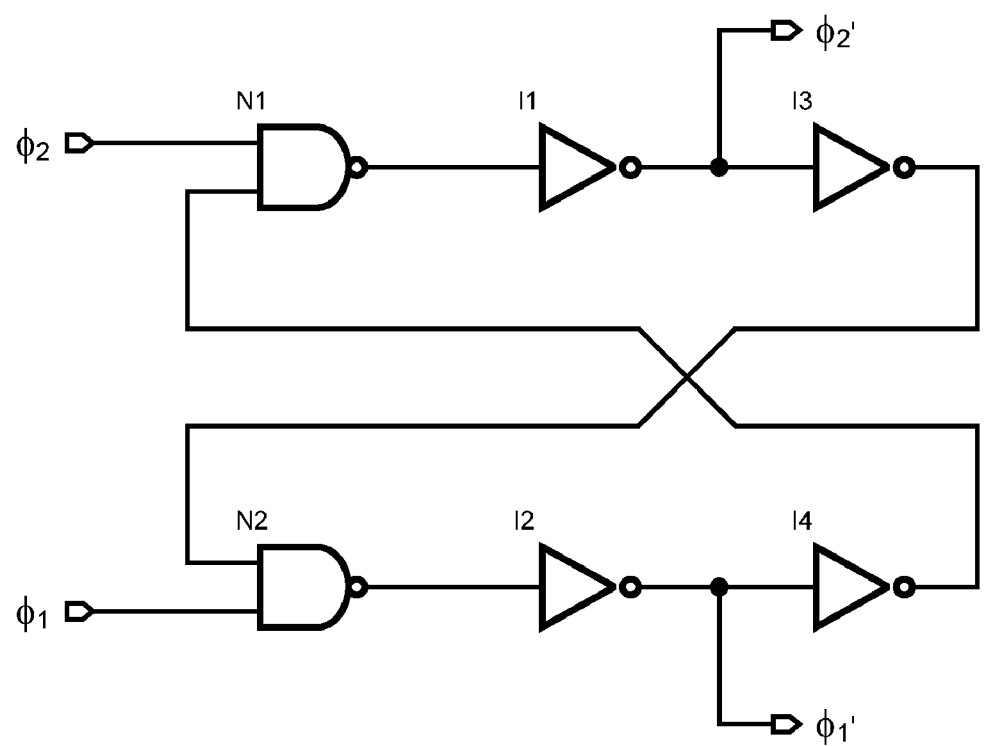
FIG. 15 presents a Prior Art Circuit for generating two-phase non-overlapping clock signals.

A prior art circuit for generating two-phase non-overlapping clock signals is shown in FIG. 15 (see "Principles of CMOS Design", N. H. E. Weste and K. Eshraghian, section 5.5.10, Addison-Wesley, 1993).

Figure 16:
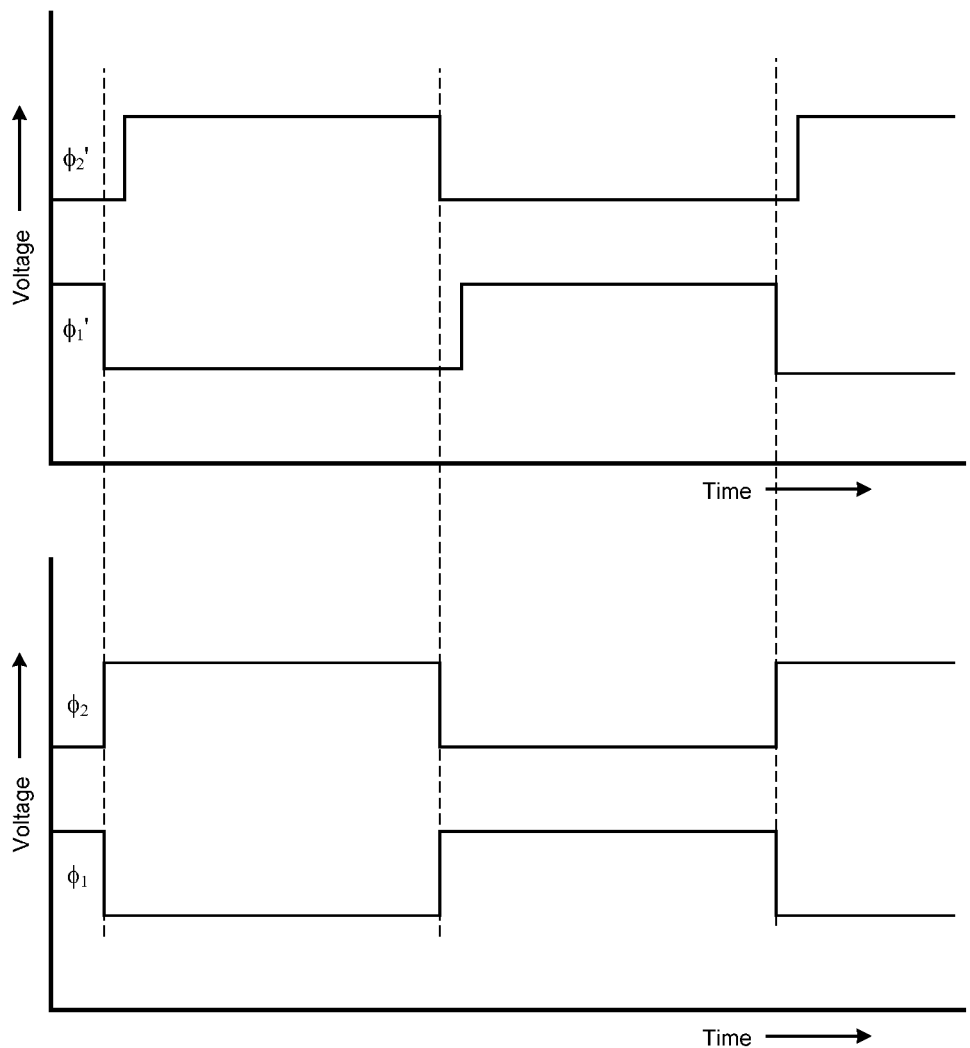
FIG. 16 illustrates the two-phase non-overlapping clock signals of the Prior Art circuit of FIG. 15.

It generates the two non-overlapping clock phases $\phi_1'$ and $\phi_2'$ from the potentially overlapping input clock phases $\phi_1$ and $\phi_2$. This process is illustrated in FIG. 16.

Operation of the circuit is as follows (assuming for simplicity that all gates are delay free, except for the inverters I3 and I4). With clock phase $\phi_1$ low and clock phase $\phi_2$ high, the output clock phases $\phi_1'$ and $\phi_2'$ will also be low and high respectively. When the two input clock phases $\phi_1$ and $\phi_2$ change states ($\phi_1$ transitioning to high and $\phi_2$ to low), output $\phi_2'$ will change almost instantaneously (see FIG. 16). This direct output response occurs because when the input $\phi_2$ to nand gate N1 goes low, its output will go high, regardless of the state of the other input to the nand gate. During the same transition ($\phi_1$ to high and $\phi_2$ to low), output $\phi_1'$ will respond with a delay. One input of the nand gate N2 is held low by inverter I3. With one input low, the output of nand gate N2 will not change its output, independently of the state of the other input that is connected to input clock phase $\phi_1$. Only when the output of I3 changes, will the output of nand N2 change, and hence output $\phi_1'$. Note that inverters I3 and I4 are assumed to exhibit noticeable delay, whereas all other gates are delay-free. The resulting output clock phases $\phi_1'$ and $\phi_2'$ are shown in FIG. 16. As indicated before, output $\phi_2'$ responds directly to the falling edge of $\phi_2$, while clock phase $\phi_1'$, tracks the rising edge of input $\phi_1$ with a slight delay. Note how the resullting output phases $\phi_1'$ and $\phi_2'$ are never on at the same time (break before make)

The next change of input state, input clock phase $\phi_1$ will go low again, and input clock phase $\phi_2$ high. The process reverses, and in this case the output $\phi_1'$ responds directly to the falling edge of $\phi_2$, while clock phase $\phi_1'$ tracks the rising edge of input $\phi_1$ with a slight delay. This timing again avoids overlap of the two output clock signals $\phi_1'$ and $\phi_2'$. Note in FIG. 16 how the output clock phases always respond directly to a falling edge of the corresponding input clock phase, whereas rising edges are tracked with a slight delay. This timing property is fundamental to producing the two non-overlapping clock signals $\phi_1'$ and $\phi_2'$.

Figure 14:
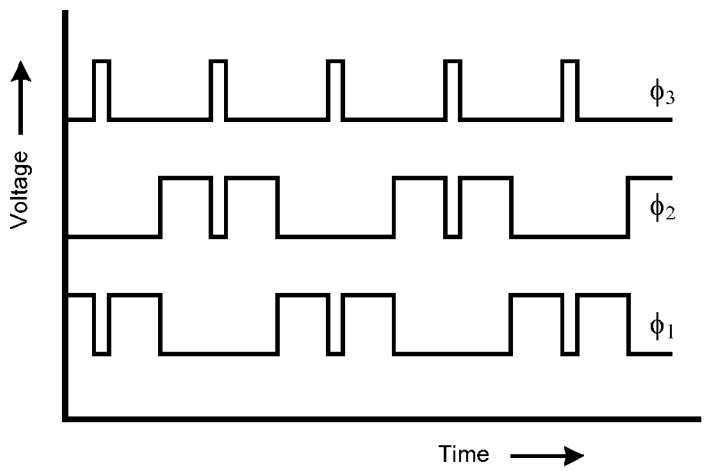
FIG. 14 illustrates the Clock phases of the chopped and autozeroed amplifier of FIG. 13.
Figure 17:
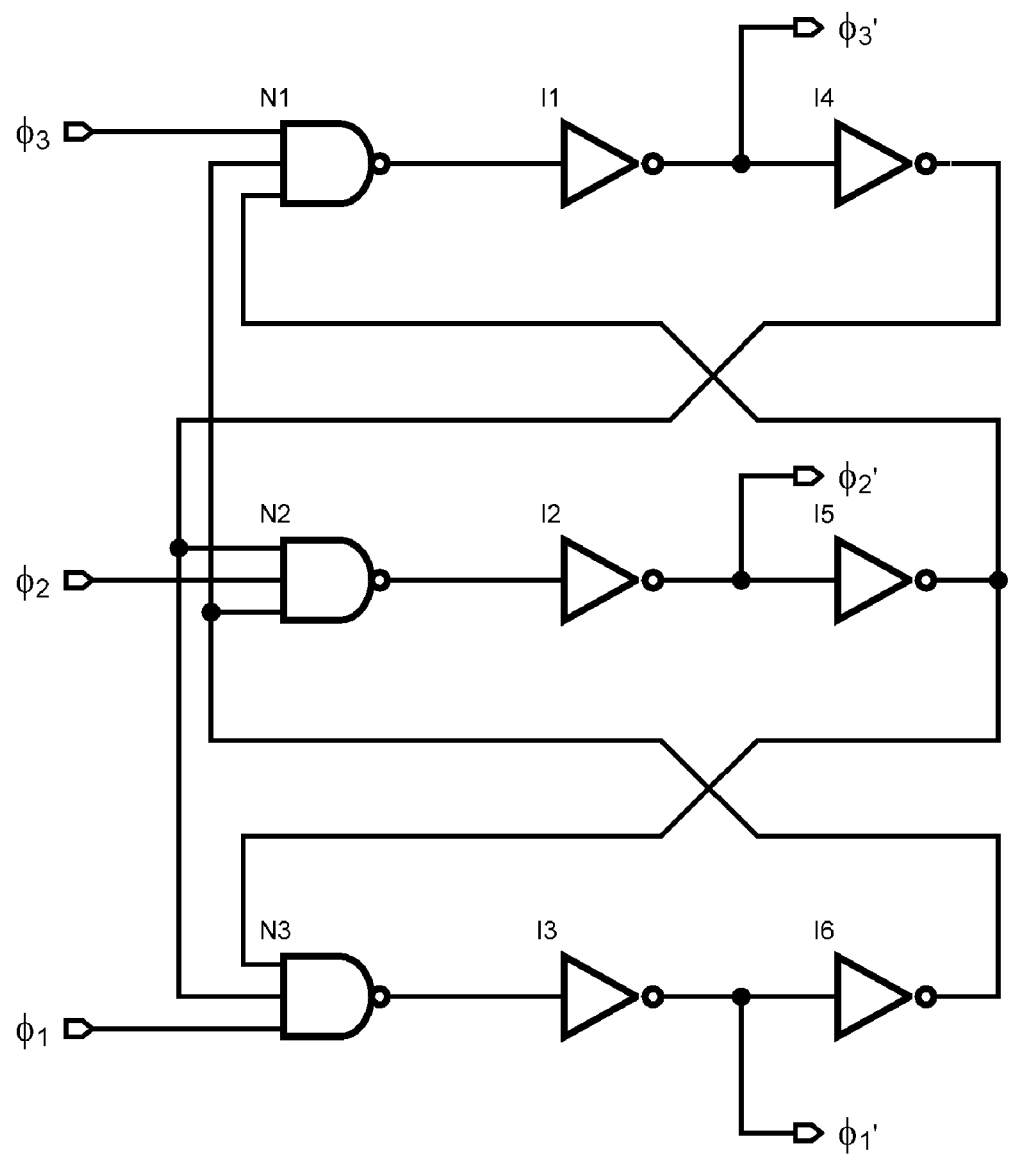
FIG. 17 presents a circuit for a three-phase non-overlapping clock generator.

FIG. 17 extends the operation of the non-overlapping clock generator of FIG. 15 to the three specific clock phases of FIG. 14. In the preferred embodiment, the three timing signals input to the circuit of FIG. 17 are generated by a simple state machine, and may be overlapping.

In this case, the circuit needs to make sure that none of the three output clock phases $\phi_1'$, $\phi_2'$ and $\phi_3'$ will ever be high at the same time. Operation is similar to that of the circuit in FIG. 15 and illustrated in FIG. 18.

For simplicity, all components are assumed to be delay-free again, except for the inverters I4, I5 and I6.

When the input clock phase $\phi_3$ is low, the output of inverter I4 is high, and the circuit part consisting of the nand gates N2 and N3, and inverters I2, I3, I5 and I6 behave identically to the prior art circuit in FIG. 15. These six components create non-overlapping clock phases $\phi_1'$ and $\phi_2'$ from the two input clock phases $\phi_1$ and $\phi_2$. Since clock phase $\phi_3$ was low to begin with, the result is that only one output clock phase $\phi_1'$, $\phi_2'$ or $\phi_3'$ will be high at a given time.

When input clock phase $\phi_3$ transitions high, the output clock phase $\phi_3'$ will wait for both other inputs to the nand gate N1 to become high as well, before it follows input clock phase $\phi_3$ in going high. The other two inputs of the nand gate N1 will go high—albeit with some delay—because both input clock phase $\phi_1$ and $\phi_2$ will be low once input clock phase $\phi_3$ has gone high. The delay is caused by one of the two inverters I5 and I6, depending on the state of the input clock phase $\phi_1$ and $\phi_2$. If input clock phase $\phi_1$ was low before the input clock transition, it will remain low, while input clock phase $\phi_2$ goes from high to low. In this case the delay is caused by inverter I5. Inverter I6 becomes responsible for the delay in the situation where input clock phase $\phi_2$ starts off and remains low, while input clock phase $\phi_1$ makes the high-to-low transition. The delay before the output clock phase $\phi_3'$ goes high, results in the non-overlap time for this clock phase.

A high-to-low transition of input clock phase $\phi_3$ affects output clock phase $\phi_3'$ almost immediately, as it causes one input to the nand gate N1 (the one connected to input $\phi_3$) to go low. One low input to the nand gate is sufficient to make the output clock phase $\phi_3'$ go low as well, regardless of the other inputs to the nand gate N1.

Since the circuit of FIG. 17 is symmetrical around all of its input-output pairs $\phi_1/\phi_1'$, $\phi_2/\phi_2'$ and $\phi_3/\phi_3'$, the same reasoning that applies to the pair $\phi_3/\phi_3'$ holds equally for the other two pairs.

Figure 18:
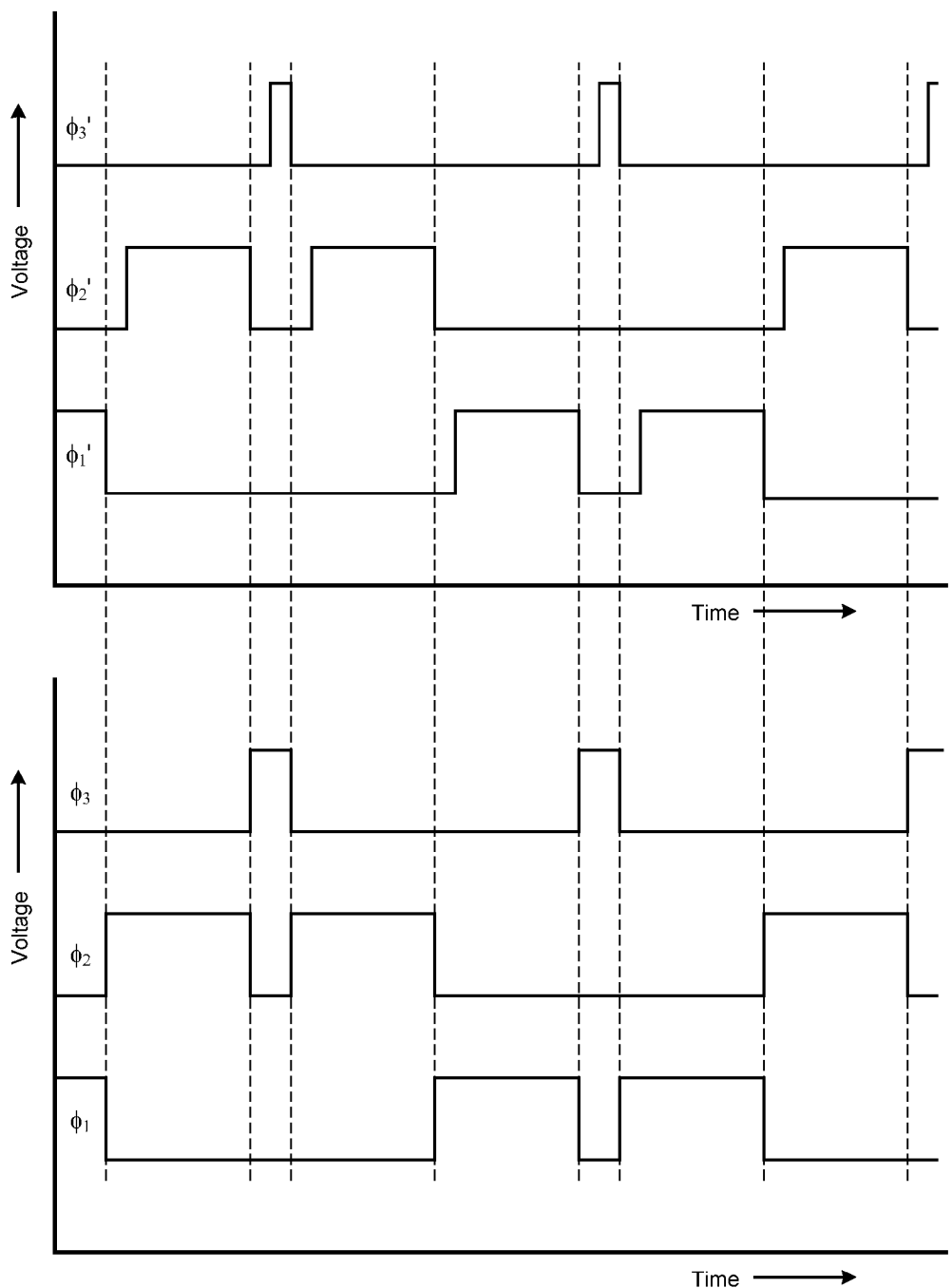
FIG. 18 illustrates the three-phase non-overlapping clock signals for the circuit of FIG. 17.

The overall result of the timing in the circuit of FIG. 17, is that the clock phase outputs $\phi_1'$ $\phi_2'$ and $\phi_3'$ will follow any high-to-low transition of their respective input clock phases $\phi_1$, $\phi_2$ and $\phi_3$ directly, while a low-to-high transition is propagated with a certain delay. FIG. 18 clearly shows how this delayed response to the rising edges creates the required three phase non-overlapping clock signals. Of course the circuit of FIG. 17 may in effect be realized using logical permutations accordingly to Bolean geometry to achieve the delay of each signal going to a first state until the both the other signals are in the second state.

Rail-to-Rail Input Switches

When operating any of the circuits FIG. 5, FIG. 7, FIG. 9, FIG. 11 or FIG. 12 at a low supply voltage while requiring a rail-to-rail input common-mode voltage range, the need arises for bootstrapped input switches. This need is especially felt when the supply voltage of the amplifier is lower then the sum of the threshold voltages of an NMOS and a PMOS device in the manufacturing process technology. Under these circumstances, we are not able to operate traditional complementary transmission gates at the inputs.

A transmission gate consists of the parallel connection of a PMOS and NMOS switch, each of which is operated by an opposite phase signal at its gate. To turn the transmission gate on, the gate of the NMOS device is pulled high, while the gate of the PMOS device is pulled low. At supply voltages below the sum of the threshold voltages of the NMOS and PMOS device, an area in the middle of the common-mode voltage range of the switch will occur where neither of the two devices can develop enough voltage across its gate-source terminals to be turned on.

Figure 19:
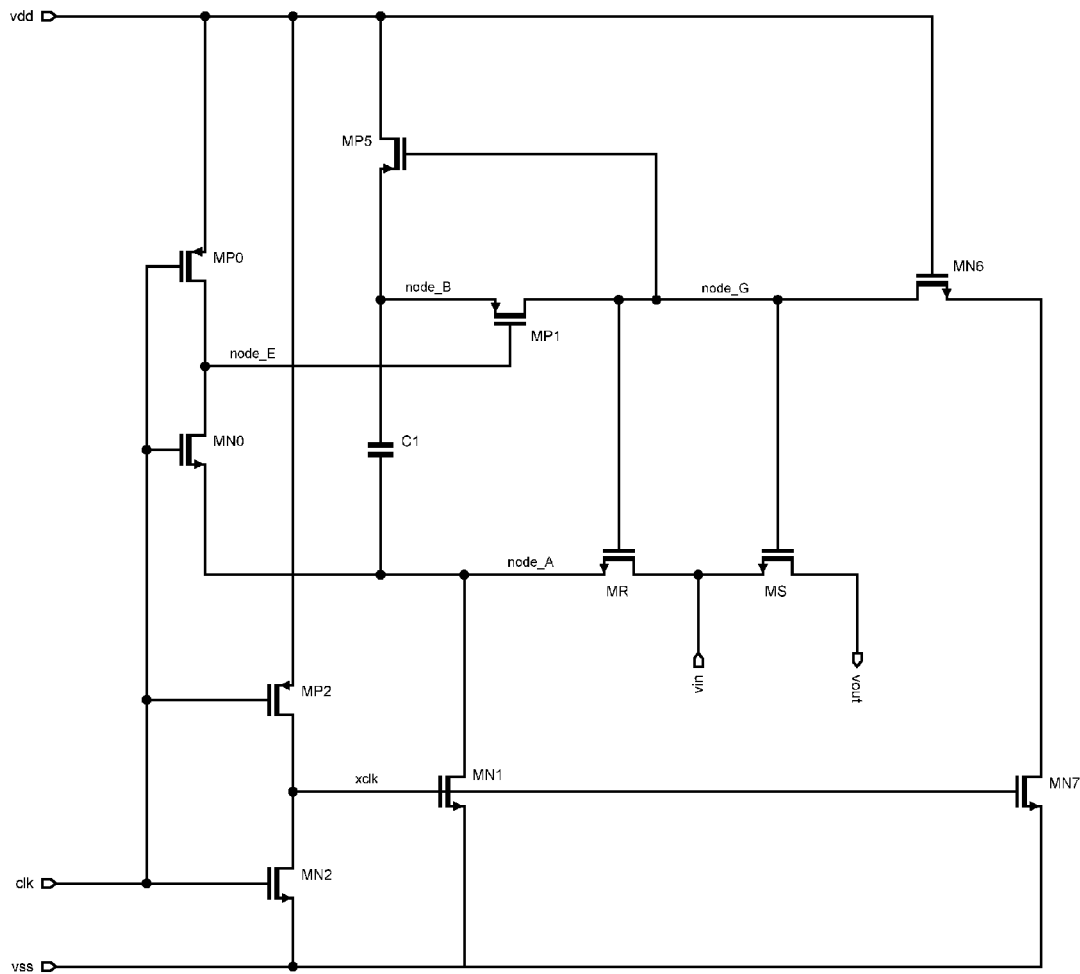
FIG. 19 presents a Prior Art circuit for a Bootstrapped input switch circuit.

The alternative to a transmission gate is to use a single NMOS or PMOS device, with a gate drive voltage that can rise above (NMOS) or drop below (PMOS) the supply voltage of the circuit. FIG. 19 shows an example of a prior art bootstrapped NMOS switch that uses a capacitor to increase the control voltage at the gate of the switching device (see "Very low-voltage digital-audio ΣΔ modulator with 88-dB dynamic range using local switch bootstrapping", M. Dessouky and A. Kaiser, IEEE J. Solid-State Circuits, vol. 36, no. 3, pp. 349-355, March 2001).

Operation of the bootstrapped switch is as follows. While the input terminal clk is held low (switch turned off), device $M_{N7}$ pulls down node G (gates of the switching transistor) through cascode device $M_{N6}$. Switch devices MR and MS are in their off states, while capacitor $C_1$ is being charged to the supply voltage by devices $M_{P5}$ and $M_{N1}$. Devices $M_{P0}$ and $M_{P1}$ are off. Stepping the control voltage clk high (turning the switch on), device $M_{N0}$ pulls down node E, and device $M_{P1}$ will start to conduct current. Device $M_{P1}$ on its turn will connect the pre-charged capacitor $C_1$ between the gate and source of device $M_R$, which will also turn on. With devices $M_{P1}$ and $M_R$ in their on states, the gate-source voltage of the switching device $M_S$ equals the voltage $V_{dd}$ stored on the capacitor $C_1$. With its gate-source voltage $V_{gs}$ above the threshold voltage, the switch devices $M_S$ will turn on.

Even though the voltages at node G and node B can rise significantly above the supply voltage (maximally twice $V_{dd}$), safe operation of all devices is guaranteed.

There are two apparent drawbacks of the prior art circuit in FIG. 19. The first is that the circuit requires a capacitor for each input switch. Since the disclosed circuits will be operating a total of six input switches, the six capacitors will represent a considerable die area penalty. Secondly, operating the switch will cause a major switching glitch in the signal path. This glitch is especially apparent while turning the switch on. In that case, device $M_R$ is closed, while node A is still at the ground potential $V_{ss}$. With device $M_R$ closed, node A needs to be lifted all the way up to the common-mode voltage level at the input terminal $V_{in}$. The charge needed for this voltage jump is pulled from the input terminal $V_{in}$, leading to the switching glitch.

Figure 20:
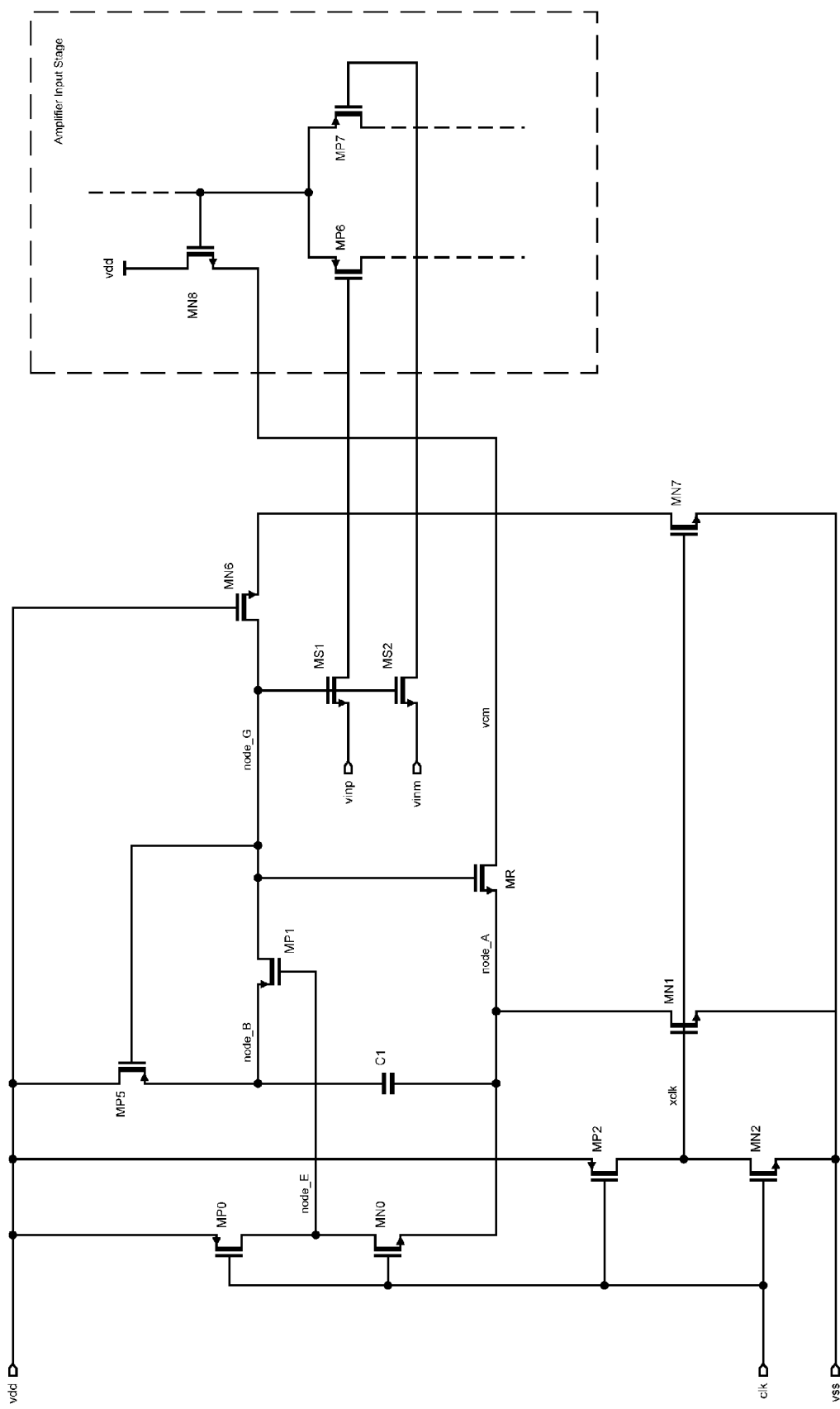
FIG. 20 presents a circuit for an improved bootstrapped switch with reduced switching glitch and die area.

The circuit of FIG. 20 alleviates the die size penalty and switching glitches associated with the prior art circuit of FIG. 19.

The circuit of FIG. 20 uses only one gate-drive capacitor $C_1$ to drive the two input switch devices $M_{S1}$ and $M_{S2}$. Since all six input switches in FIG. 11 and FIG. 12 come in three pairs that are driven by the same clock phase, this reduces the total number of capacitors from six to three. This is not needed between stages, as the common mode voltage may be controlled (limited) so a rail to rail switching voltage may be used for these switches.

The key modification to allow driving multiple switch devices with one bootstrap circuit is the use of voltage $v_{cm}$ as a reference to lift gate-control capacitor $C_1$, instead of the source of the switch device $M_s$ in the prior art circuit of FIG. 19. Disconnecting the sources of the switches MS1 and MS2 from the bootstrap circuit has the added benefit of avoiding the switching glitch that arose in the prior art circuit of FIG. 19.

The key to successfully operating the switch devices $M_{S1}$ and $M_{S2}$ in FIG. 20 lies in generating the proper common-mode voltage $v_{cm}$. This voltage $v_{cm}$ is derived through source follower $M_{N8}$ from the voltage at the sources of the input transistors $M_{P6}$ and $M_{P7}$ of the overall amplifier circuit, $M_{P6}$ and $M_{P7}$ being the differential transistor pair in a differential input stage for the amplifier system. Because of this connection, the common mode voltage $v_{cm}$ has two important properties:

1. The voltage $v_{cm}$ will track the minimum of the two voltages at the gates of input transistors $M_{P6}$ and $M_{P7}$. This is due to the fact that the input device with the lowest gate voltage, e.g. $M_{P6}$, will start acting as a source follower, tracking the voltage at its gate with the source, while the other device ($M_{P7}$ in this example) will be turned off by lack of a sufficiently high gate-source voltage $V_{gs}$. In a typical amplifier application, the differential input will be minimal, so that the voltage $v_{cm}$ will accurately reflect the common mode voltage of the differential input. Note also, that only one source follower $M_{N8}$ need be used for all switches coupled to that differential input.

2. Because of source follower $M_{N8}$, the common mode voltage $v_{cm}$ can never exceed the positive rail $V_{dd}$, even if the tail current source of the input pair $M_{P6}$ and $M_{P7}$ is connected to a voltage higher than the supply voltage $V_{dd}$. A common situation where the input stage tail current source is tied to a higher supply voltage than the remainder of the amplifier is in amplifiers that employ a charge-pump to obtain a rail-to-rail input common-mode range. The charge pump generates a boosted supply voltage for the input stage, extending its common mode input voltage range.

Because of these two points, the circuit continues to guarantee safe operation of all devices in the circuit. The gate of the switching devices $M_{S1}$ and $M_{S2}$ will never be pulled higher than one supply voltage $V_{dd}$ above the minimum of the two input voltages $V_{inp}$ and $V_{inm}$. Consequently, the gate-source voltages $V_{gs}$ of switching devices $M_{S1}$ and $M_{S2}$ cannot exceed the supply voltage $V_{dd}$. Also, node E, which is connected to $v_{cm}$ when switch devices $M_{N0}$ and $M_R$ are closed, cannot exceed the supply voltage $V_{dd}$. This is critical to avoid forward biasing of the backgate diode of $M_{P3}$.

Operation of the circuit is similar to that of the prior art circuit in FIG. 19: when input terminal clk is low (switch turned off), device $M_{N7}$ pulls down node G (gates of the switching transistors) through cascode $M_{N6}$. Switch devices $M_{S1}$ and $M_{S2}$ are in their off states, while capacitor $C_1$ is being charged to the supply voltage by devices $M_{P5}$ and $M_{N1}$. Devices $M_{P0}$ and $M_{P1}$ are off. When the control voltage clk goes high (turning the switch on), device $M_{N0}$ pulls down node E, and device $M_{P1}$ will start to conduct current. Device $M_{P1}$ in turn will connect the pre-charged capacitor $C_1$ between the gate and source of device $M_R$, which will also turn on. With devices $M_{P1}$ and $M_R$ in their on states, the voltage at node G will be the common-mode voltage $v_{cm}$ plus the voltage $V_{dd}$ stored on the capacitor. The result is that the gate-source voltages $V_{gs}$ of the switch devices $M_{S1}$ and $M_{S2}$ will rise above their threshold voltages and turn the two devices on.

The embodiments shown and described herein use differential amplifiers. It should be noted that a single ended amplifier is functionally a differential amplifier with one input and/or one output connected to a circuit ground. Similarly, a chopper alternately reverses two inputs, independent of whether one is a circuit ground or not. Accordingly references herein and in the following claims to differential amplifiers is a reference that includes amplifiers with one input and/or one output connected to a circuit ground, i.e., commonly referred to as single ended amplifiers. Also the embodiments shown and described herein are shown and described with respect to MOS transistors, though other active devices may be used, such as, by way of example, bipolar transistors.

Thus the present invention has a number of aspects, which aspects may be practiced alone or in various combinations or sub-combinations, as desired. While certain preferred embodiments of the present invention have been disclosed and described herein for purposes of illustration and not for purposes of limitation, it will be understood by those skilled in the art that various changes in form and detail may be made therein without departing from the spirit and scope of the invention as defined by the full breadth of the following claims.

What is claimed is:

1. In an amplifier system, a circuit comprising:
   a first differential amplifier;
   first and second choppers for chopping the input and the output of the first differential amplifier, respectively;
   autozero circuitry coupled to the first differential amplifier for autozeroing the first differential amplifier;
   the autozero circuitry operating at a first frequency and the choppers operating at a second frequency, the first frequency being twice the second frequency, the second frequency having a 50% duty cycle;
   the first frequency having a duty cycle of less than 50%;
   each half cycle of the choppers being interrupted while the first differential amplifier is auto-zeroed.

2. The circuit of claim 1 further comprising an amplifier having differential inputs coupled to the first and second differential inputs of the amplifier system and an output coupled to the output amplifier.

3. The circuit of claim 1 wherein the first frequency has a duty cycle of not more than 25%.

4. In an amplifier system, a circuit comprising:
   a first differential amplifier;
   first and second choppers for chopping the input and the output of the first differential amplifier, respectively;
   the first chopper being coupled to the first and second differential inputs of the amplifier system;
   a first-switch having a first first-switch state coupling the differential inputs of the first differential amplifier to differential outputs of the first chopper, and a second first-switch state connecting the differential inputs of the first differential amplifier together;
   a second differential amplifier, the second differential amplifier having differential inputs, each connected to a circuit ground through a respective capacitance;
   differential outputs of the first and second differential amplifiers being coupled in common;
   an output amplifier having an input coupled to an output of the second chopper;
   a second-switch having a first second-switch state coupling the common outputs of the first and second differential amplifiers to an input of the second chopper, and a second second-switch state coupling the common outputs of the first and second differential amplifiers to the differential inputs of the second differential amplifier;
   the first and second switches operating at a first frequency and the choppers operating at a second frequency unequal to the first frequency.

5. The circuit of claim 4 wherein the second frequency is twice the first frequency, and the first and second frequencies each have a 50% duty cycle.

6. The circuit of claim 4 wherein the first frequency is twice the second frequency, the second frequency having 50% duty cycle.

7. The circuit of claim 6 wherein the first frequency has a duty cycle of less than 50%, whereby each half cycle of the choppers is interrupted while the first differential amplifier is auto-zeroed.

8. The circuit of claim 6 wherein the first frequency has a duty cycle of not more than 25%, whereby each half cycle of the choppers is interrupted while the first differential amplifier is auto-zeroed.

9. The circuit of claim 6 further comprising:
   third and fourth differential amplifiers, the fourth differential amplifier having differential inputs, each connected to a circuit ground through a respective capacitance, differential outputs of the third and fourth differential amplifiers being coupled in common;
   the first-switch when in the first first-switch state also coupling the differential inputs of the third differential amplifier together and coupling the common outputs of the third and fourth differential amplifiers to the differential inputs to the fourth differential amplifier;
   the first-switch when in the second first-switch state coupling the differential outputs of the first chopper to the differential inputs of the third differential amplifier and coupling the common differential outputs of the third and fourth differential amplifiers to the differential inputs of the second chopper.

10. The circuit of claim 9 further comprising an amplifier having differential inputs coupled to the first and second differential inputs of the amplifier system and an output coupled to the output amplifier.

11. The circuit of claim 6 wherein:
   the first and second switches and the first and second choppers comprise third, fourth and fifth switches, each having an open and a closed state;
   the first differential input of the amplifier system being connectable to a first differential input of the first differential amplifier by third and fifth switches, and to a second differential input of the first differential amplifier by the fourth and fifth switches;

the second differential input of the amplifier system being connectable to the first differential input of the first differential amplifier by the fourth switch, and to the second differential input of the first differential amplifier by the third switch;

a first common connection of the outputs of the first and third differential amplifiers being connectable to a first differential input of the differential output amplifier through the third switch and to a second differential input to the differential output amplifier through the fourth switch;

a second common connection of the outputs of the first and second differential amplifiers being connectable to a first input of the differential output amplifier through the fourth switch and to a second input to the differential output amplifier through the third switch;

the common connection of the differential outputs of the first and second differential amplifiers being connectable to the differential inputs of the second differential amplifier by the fifth switch.

12. The amplifier of claim 11 wherein the output amplifier is a multiple stage amplifier.

13. The circuit of claim 11 further comprising a third amplifier having differential inputs coupled to the differential inputs of the amplifier system and an output coupled to the output amplifier.

14. The circuit of claim 11 wherein the third switches are all closed at the same time, but not when the fourth and fifth switches are closed, the fourth switches are all closed at the same time, but not when any of the third and fifth switches are closed, and the fifth switches are all closed at the same time, but not when any of the third or fourth switches are closed, whereby the switch operation is nonoverlapping, the fifth switches being closed at the first frequency with a duty cycle of less than 50%, the third switches being closed at a second frequency with a duty cycle of approximately 50%, except as interrupted for the closure of the fifth switches, and the fourth switches being closed at the second frequency with a duty cycle of approximately 50%, except as interrupted for the closure of the fifth switches.

15. The amplifier of claim 14 wherein the fifth switches are closed with a duty cycle of not more 25%.

16. The amplifier of claim 14 wherein the output amplifier is a multiple stage amplifier.

17. The circuit of claim 14 further having third and fourth differential inputs of the amplifier system forming a second differential input port, and further comprising:

a third differential amplifier having first and second differential inputs;

the third differential input of the amplifier system being connectable to the first differential input of the third differential amplifier by third and fifth switches, and to the second differential input of the third differential amplifier by the fourth and fifth switches;

the fourth differential input of the amplifier system being connectable to the first differential input of the third differential amplifier by the fourth switch and to the second differential input of the third differential amplifier by the third switch;

differential outputs of the third differential amplifier being coupled in common with the differential outputs of the first and second differential amplifiers.

18. The circuit of claim 17 further comprising fourth and fifth differential amplifiers, the fourth differential amplifier having differential inputs coupled to the first and second differential inputs of the amplifier system and an output coupled to the output amplifier, and the fifth differential amplifier having differential inputs coupled to the third and fourth differential inputs of the amplifier system and an output coupled to the output amplifier.

19. The circuit of claim 14 further comprising:

a timing circuit for providing three output timing signals for controlling the timing of the third, fourth and fifth switches respectively, the output timing signals having first and second states and being nonoverlapping in the second state, the three output timing signals being provided from three input signals of first and second states, any of which input signals may overlap in the second state, comprising:

logic coupled to delay the change of a first output timing signal to the second state response to a change of the first input signal to the second state until after both second and third output signals are in the first state;

logic coupled to delay the change of a second output timing signal to the second state response to a change of the second input signal to the second state until after both first and third output signals are in the first state; and, logic coupled to delay the change of a third output timing signal to the second state response to a change of the third input signal to the second state until after both first and second output signals are in the first state.

20. The circuit of claim 19 further comprising:

switch drive circuits for driving the third, fourth and fifth switches on the first and second differential inputs to the amplifier system to control their on and off states, respectively, each drive circuit being responsive to a respective output timing signal of the timing circuit, to control the on and off states of the third, fourth and fifth switches, respectively;

circuitry for connecting a first lead of a capacitor to a power supply voltage, a second capacitor lead to a circuit ground and holding the respective switch in the off state when the respective output timing signal is its first state; and, circuitry for connecting the second lead of the capacitor to a voltage responsive to a common mode voltage of the first and second differential inputs of the amplifier system and connecting the first capacitor lead to a control voltage for the respective switch when the circuit is clocked by a respective output timing signal;

whereby the control voltage for turning on the switches is approximately one power supply voltage above the common mode voltage of the first and second differential inputs of the amplifier system, independent of what the common mode voltage is.

21. A method of operating a chopper stabilized first amplifier, the chopper stabilized first amplifier having an auto-zeroing capability comprising:

operating the chopper stabilization at a first frequency; and, operating the auto-zeroing at a second frequency;
the ratio of the frequencies being two to one;
the second frequency being twice the first frequency and having a duty cycle of less than one half.

22. A method of operating a chopper stabilized first amplifier, the chopper stabilized first amplifier having an auto-zeroing capability comprising:

operating the chopper stabilization at a first frequency; and, operating the auto-zeroing at a second frequency;
the ratio of the frequencies being two to one;
the second frequency having a duty cycle of not more than one-quarter.

23. A method of operating a chopper stabilized first amplifier, the chopper stabilized first amplifier having an auto-zeroing capability comprising:

operating the chopper stabilization at a first frequency; and,
operating the auto-zeroing at a second frequency;
the ratio of the frequencies being two to one;
after each cycle of the chopper stabilization of the first amplifier, chopper stabilizing a second amplifier using the same choppers;
auto-zeroing the second amplifier while the first amplifier is being chopper stabilized; and,
auto-zeroing the first amplifier while the second amplifier is being chopper stabilized;
the outputs of the first and second amplifiers being connected in common.

24. A method of operating a chopper stabilized first amplifier, the chopper stabilized first amplifier having an auto-zeroing capability wherein the chopper stabilized first amplifier has first, second and third pluralities of open and closed switches, the first and second switches being coupled as input and output chopper switches and the third switches being coupled as auto-zero switches, wherein the first switches are all closed at the same time, but not when the second and third switches are closed, the second switches are all closed at the same time, but not when any of the first and third switches are closed, and the third switches are all closed at the same time, but not when the first or second switches are closed, whereby the switch operation is nonoverlapping, the third switches being closed at a first frequency with a duty cycle of less than 50%, the first switches being closed at a second frequency equal to one half the first frequency with a duty cycle of approximately 50%, except as interrupted for the closure of the third switches, and the second switches being closed at the second frequency with a duty cycle of approximately 50%, except as interrupted for the closure of the third switches;
operating the first and second switches at a first frequency; and,
operating the third switches at a second frequency;
the ratio of the frequencies being two to one.

25. The method of claim 24 wherein the third switches are closed with a duty cycle of not more 25%.

26. The method of claim 25 wherein the output amplifier is a multiple stage amplifier.

27. The method of claim 24 wherein the first amplifier has first and second differential inputs and further comprising:
controlling, responsive to a clocking signal, the on and off states of switches controlling the connection of the first and second differential inputs to differential amplifier system inputs and to themselves, the differential amplifier system inputs having a common mode voltage, comprising, for each pair of switches:
connecting a first lead of a capacitor to a power supply voltage, a second capacitor lead to a circuit ground and holding the switches in the off state when the switch control circuit is not being clocked by one of a first, second or third timing signal; and,
connecting the second lead of the capacitor to a voltage responsive to the common mode voltage and connecting the first capacitor lead to a control voltage when the circuit is clocked by the respective first, second or third timing signal;
whereby the control voltage for turning on the switches is approximately one power supply voltage above the common mode voltage, independent of what the common mode voltage is.

28. The method of claim 27 further comprising:
providing the first, second and third timing signals, each having first and second states corresponding to switch on and off states, the three timing signals being nonoverlapping in the first state from three input signals of first and second states, any two of which may overlap in the first state by;
delaying the change of the first timing signal to the first state response to a change of the first input signal to the first state until after both the second and the third timing signals are in the second state;
delaying the change of the second timing signal to the first state response to a change of the second input signal to the first state until after both the first and the third output signals are in the second state; and,
delaying the change of the third timing signal to the first state response to a change of the third input signal to the first state until after both the first and the second output signals are in the second state.

* * * * *